US009043735B1

(12) United States Patent
Das et al.

(10) Patent No.: US 9,043,735 B1
(45) Date of Patent: May 26, 2015

(54) SYNTHESIS OF FAST SQUARER FUNCTIONAL BLOCKS

(75) Inventors: Sabyasachi Das, Santa Clara, CA (US); Jean-Charles Giomi, Menlo Park, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 543 days.

(21) Appl. No.: 11/408,740

(22) Filed: Apr. 21, 2006

(51) Int. Cl.
  G06F 17/50 (2006.01)
  G06F 7/552 (2006.01)
  G06F 7/508 (2006.01)

(52) U.S. Cl.
  CPC .............. *G06F 17/505* (2013.01); *G06F 7/552* (2013.01); *G06F 7/508* (2013.01); *G06F 2207/5523* (2013.01)

(58) Field of Classification Search
  USPC ............................. 716/18; 708/603, 625, 656
  See application file for complete search history.

(56) References Cited

U.S. PATENT DOCUMENTS 6,018,758 A *  1/2000  Griesbach et al. ............ 708/606
  6,769,007 B2 *  7/2004  Sutherland et al. ........... 708/700

OTHER PUBLICATIONS

J. Pihl, E. J. Aas, "A Multiplier and Squarer Generator for High Performance DSP Applications", Proceedings of IEEE 39th Midwest Symposium on Circuits and Systems, vol. 1, pp. 109-112, 1997.*
A. J. Al-Kahlili, A. Hu, "Design of a 32-bit Squarer—Exploiting Addition Redundancy", Proceedings of the 2003 International Symposium on Circuits and Systems, vol. 5, pp. V-325-V-328, 2003.*

P. F. Stelling, V. Oklobdzija, "Design Strategies for the Final Adder in a Parallel Multiplier", 1995 Conference Record of the Twenty-Ninth Asilomar Conference on Signals, Systems and Computers, vol. 1, pp. 591-595, 1996.*
V. G. Oklobdzija et al., "A Method for Speed Optimized Partial Product Reduction and Generation of Fast Parallel Multipliers Using an Algorithmic Approach", IEEE Transactions on Computers, vol. 45, issue 3, pp. 294-306, Mar. 1996.*
Das et al., "A Timing-Driven Synthesis Approach of a Fast Four-Stage Hybrid Adder in Sum-of-Products", MWSCAS: 51$^{st}$ Symposium on Circuits and Systems, Aug. 2008, pp. 507-510.*
J. Pihl, E.J. AAS, "A Multiplier and Squarer Generator for High Performance DSP Applications" in Proceeding of IEEE 39th Midwest Symposium on Circuits and Systems, pp. 109-112, 1997.
J.T. Yoo, K.F. Smith, G. Gopalakrishnan, "A Fast Parallel Squarer Based on Divide-and-Conquer" in IEEE Journal on Solid State Circuits, vol. 32, No. 1, pp. 909-912, Jun. 1997.

(Continued)

*Primary Examiner* — Jack Chiang
*Assistant Examiner* — Aric Lin
(74) *Attorney, Agent, or Firm* — Alford Law Group, Inc.

(57) ABSTRACT

In one embodiment of the invention, an integrated circuit (IC) design tool is provided for synthesizing logic, including one or more software modules to synthesize a gate-level netlist of a squarer functional block. The software modules include a bitvector generator, a bitvector reducer, and a hybrid multibit adder generator. The bitvector generator multiplies bits of a vector together to generate partial products for a plurality of bitvectors and then optimizes a plurality of least significant bitvectors. The bitvector reducer reduces the partial products in the bitvectors of the squarer functional block down to a pair of final vectors. The hybrid multibit adder generator generates a hybrid multibit adder including a first adder and a second adder coupled together by a carry bit with bit widths being responsive to a dividerbit. The hybrid multibit adder adds the pair of final vectors together to generate a final result for the squarer functional block.

27 Claims, 13 Drawing Sheets

(56) References Cited

OTHER PUBLICATIONS

R.K Kolagotla, W.R. Griesbach, H.R. Srinivas, "VLSI Implementation of 350MHz 0.35 μm, 8 Bit Merged Squarer", in IEEE Electronics Letters, vol. 34, No. 1, pp. 47-48, Jan. 1998.

A.G.M. Strollo, E. Napoli, D. De Caro, "A New Design of Squarer Circuits Using Booth Encoding and Folding Techniques" in Proceedings of 8th IEEE International Conference on Electronics, Circuits and Systems, Malta, pp. 193-196, Sep. 2-5, 2001.

A.G.M. Strollo, D. De Caro, "Booth Folding Encoding for High Performance Squarer Circuits" in IEEE Transaction on Circuits and Systems II: Analog and Digital Signal Processing, vol. 50, No. 5, pp. 250-254, May 2003.

Y. Jeang, L.B. Chen, J.H. Tu, I.J. Huang "An Efficient and Low Power Systolic Squarer" in Proceedings of IEEE International Symposium on VLSI Design Automation and Test, pp. 37-40, Apr. 27-29, 2005.

C.S. Wallace, "A Suggestion for a Fast Multiplier" in IEEE Transaction on Electronic Computers, pp. 14-17, 1964.

L. Dadda, "Some Schemes for Parallel Multiplies" in Alta Frequenza, vol. 34, pp. 349-356, 1965.

K.C. Bickerstaff, E.E. Swartzlander, M.J. Schulte, "Analysis of Column Compression Multipliers", in Proceedings of 15th IEEE Symposium on Computer Arithmetic, pp. 33-39, 2001.

R.P. Brent, H.T. Kung, "A Regular Layout for Parallel Adders", in IEEE Transaction on Computers, pp. 260-264, 1982.

P.M. Kogge, H.S. Stone, "A Parallel Algorithm for Efficient Solution of a General Class of Recurrence Equations" in IEEE Transaction on Computers, No. 8, 786-793, Aug. 1973.

P.F. Stelling, V.G. Oklobdzija, "Design Strategies for the Final Adder in a Parallel Multiplier" in Journal of VLSI Processing, pp. 591-595, 1996.

\* cited by examiner (BACKGROUND)

US 9,043,735 B1

SYNTHESIS OF FAST SQUARER FUNCTIONAL BLOCKS

FIELD

The embodiments of the invention relate generally to electronic design automation (EDA) for integrated circuits. More particularly, the embodiments of the invention relate to timing driven synthesis of squarer functional blocks within integrated circuits.

BACKGROUND

Functional blocks in semiconductor integrated circuits are often designed with the assumption that all inputs to the block arrive simultaneously together. That is, the design of the functional block assumes that the all input signals to the block are valid, steady state signals at the same time with respect to a clock signal. In many cases, this is an incorrect assumption because the input signals into functional blocks often arrive at different times.

The design of a function block may require three or more input signals be evaluated simultaneously to produce a resultant output. However, the time spent waiting for the input signals to be valid at the input to the functional block is often not considered and leads to an unexpected increase in the delay of signals through the functional block. It is desirable to consider the input signal timing during the synthesis of the logic of functional blocks in integrated circuits.

BRIEF SUMMARY

The embodiments of the invention are summarized by the claims that follow below.

BRIEF DESCRIPTIONS OF THE DRAWINGS

DETAILED DESCRIPTION

Figure 1:
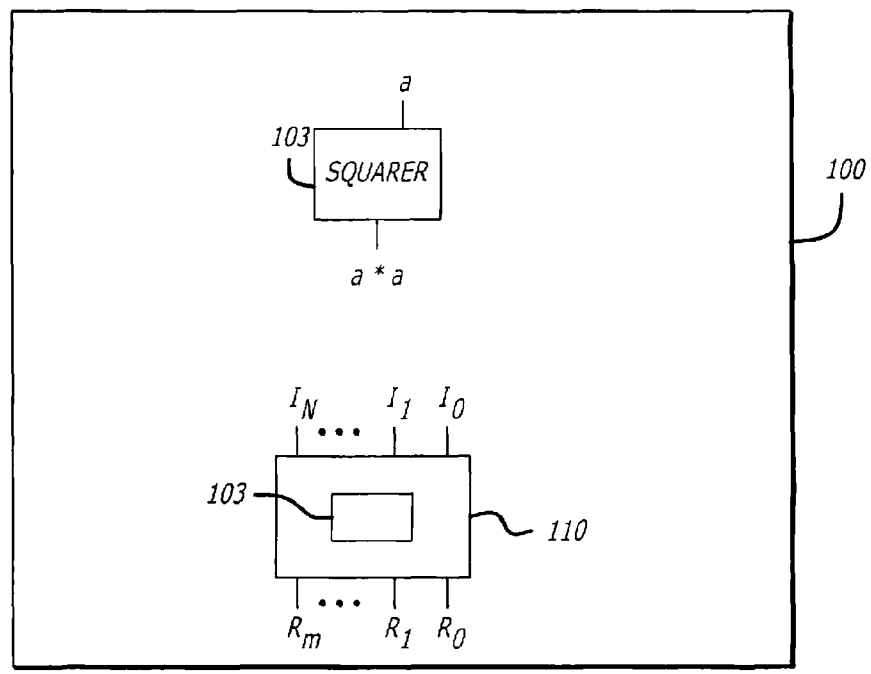
FIG. 1 is a diagram illustrating an exemplary integrated circuit with one or more functional blocks, one of which is a squarer functional block having circuit logic synthesized in accordance with the embodiments of the invention.

In the following detailed description of the embodiments of the invention, numerous specific details are set forth in order to provide a thorough understanding of the embodiments of the invention. However, it will be obvious to one skilled in the art that the embodiments of the invention may be practiced without these specific details. In other instances well known methods, procedures, components, and circuits have not been described in detail so as not to unnecessarily obscure aspects of the embodiments of the invention.

The embodiments of the invention include a method, apparatus and system for the synthesis of the circuit logic of functional blocks that generally include a computation squared vector or signal. Logic gates are generally selected for the functional blocks in response to the expected timing of input signals generated by other functional blocks.

A squarer is extensively used in Digital Signal Processing (DSP) algorithms. Some of the specific applications of squarers are pattern recognition, image compression, vector quantization, error correction, adaptive filtering, decoding, etc. Hence, any speedup in the performance (delay) of the squarer will be very beneficial to improve the performance of the whole DSP chip.

Synthesis of a squarer function generally has three steps—creation of partial-products (or BitVectors), reduction of partial products (or BitVectors), and a final carry-propagate adder.

A sum of products is a standard form to express arithmetic functions. The "sum of products", in contrast to a "product of sums", is an arithmetic expression containing multiplication terms, called product terms, of one or more vectors or variables. The sum in the "sum of products" denotes the addition operation of the partial product terms in the arithmetic expression. The "product terms" is also be referred to as "partial products" when arithmetic or DSP operations are performed on vectors.

A literal is a primed binary vector/variable (e.g., y') or unprimed binary vector/variable (e.g., y) in the Boolean expression. The unprimed binary vector/variable is the normal form of a signal. The primed binary vector/variable is the complement or inverted form of the signal often generated by using a set of inverters or NOT gates.

An example function expressed in sum of products terms is $F=y'+xy+x'yz'$. This function has three product terms of one, two, and three vectors each, respectively. The sum of these three product terms is an addition operation. The product terms are formed by, multiplying the individual vector signals.

When performing arithmetic operations on vectors having multiple bits or multiple samples, many product terms can be generated such that a plurality of adders may be needed to sum them all together to obtain the multiple bits of the resultant output. In order to reduce the number of adders and to speed the generation of the resultant output, it is desirable to reduce the number of partial product terms that are to be added together by one single adder.

In one embodiment of the invention, a timing-driven algorithm is used to optimally synthesize a faster squarer. A squarer is a functional block that may be used extensively in Digital Signal Processing (DSP) algorithms. Hence a faster squarer is becoming increasingly important for the performance of modern DSP chips.

To explain the algorithms herein, a BitVector, is defined as a set of individual partial-product bits or terms, which belong to the $i^{th}$ bit. In one embodiment of the invention, a squarer function block is formed by the following algorithms:

BitVector Generation and Optimization,
BitVector Reduction,
DividerBit Computation
Hybrid Multibit Adder Generation.

In the BitVectors generation, five least significant bits may be optimized for a squarer functional block. Due to this simplification, four (4) of the least significant sum output bits of the squarer can be generated, without BitVector reduction, DividerBit computation, and Hybrid Multibit Adder generation. In the reduction of BitVectors, any reduction algorithm may be used to reduce the BitVectors. In computing the DividerBit, we introduce a timing-driven approach to optimally divide the hybrid multibit adder into two sub-adders. After determining the division scheme of the hybrid multibit adder, we use a timing driven approach in generating the hybrid multibit adder.

The embodiments of the invention optimize BitVectors and use a timing-driven approach to synthesize a Hybrid Multibit Adder, resulting in faster performance of a squarer functional block.

Referring now to FIG. 1, an integrated circuit 100 includes a number of functional blocks 103,110. Each of these functional blocks may have its logical circuitry synthesized or generated by an ECAD tool in one embodiment of the invention. Each of these functional blocks 103,110 may be present in data paths of an integrated circuit. Functional block 103 is a squarer to multiply a vector a with itself to obtain the result $a*a$ or $a^2$. Functional block 110 is any functional block that includes a squarer functional block 103 to perform a squaring logical operation and evaluate any expression of the general form of $a*a$ or $a^2$. That is, functional block 110 generally includes logical circuitry to perform a squaring mathematical operation.

Figure 2:
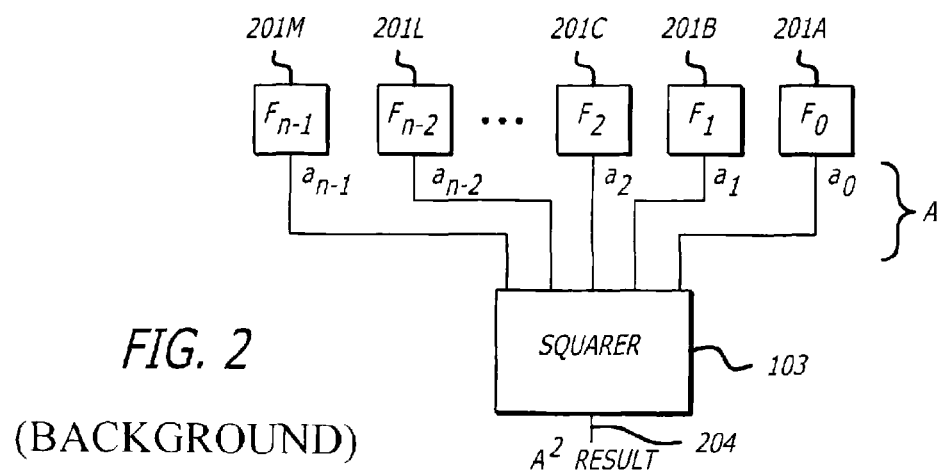
FIG. 2 is a diagram illustrating functional blocks in an integrated circuit design that provide differing arrival times to a squarer functional block.

Referring now to FIG. 2, a squarer functional block 103 receives a vector input signal A with bits $a_0$ through $a_{n-1}$ respectively from function blocks $F_0$ 201A through $F_{n-1}$ 201M. The Result 204 of the squarer is $A*A$ or $A^2$. Each of the input bits $a_0$ through $a_{n-1}$ of vector A into the squarer may arrive at the squarer at different times. That is, the delay or arrival times of each input bit $a_0$ through $a_{n-1}$ to the squarer functional block 103 may be different. In the logic synthesis of the squarer functional block 103, a logic synthesizer may consider the difference in timing of input signals and other logic delays.

Figure 5:
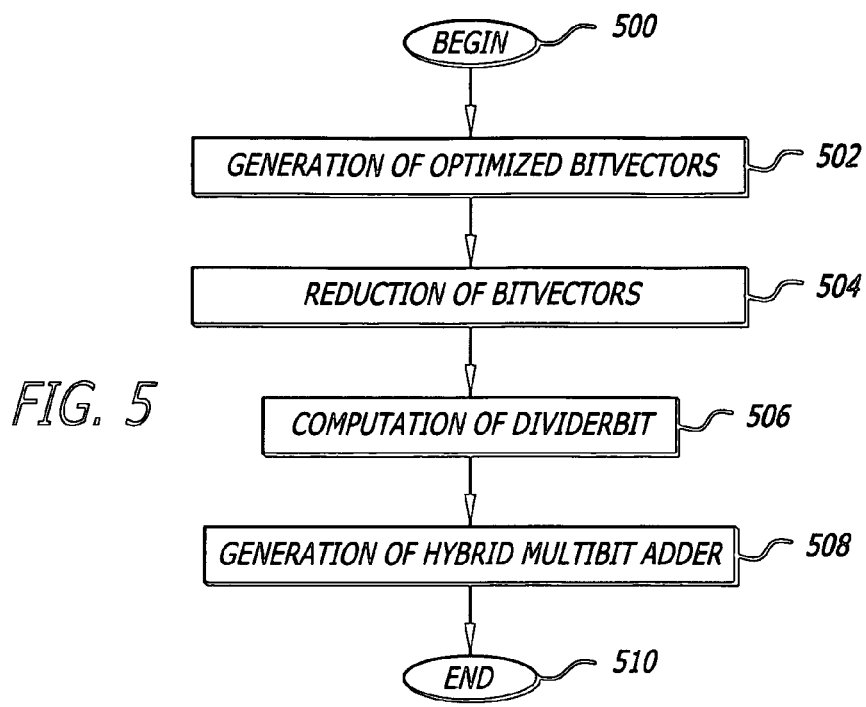
FIG. 5 is a flow chart of a squarer synthesis method performed by embodiments of the invention.

Referring now momentarily to FIG. 5, a method of the general logic synthesis of a squarer functional block is illustrated. The method starts at block 500 and then at block 502, optimized BitVectors are generated. Next at block 504, each BitVector is reduced down to one or two bits of a pair of multi bit numbers or vectors. Then a DividerBit is generated at block 506 to determine how to generate or form a hybrid multi-bit adder in response to the timing of input signals and other logic delays. Next at block 508, a hybrid multibit adder is generated in response to the DividerBit. The hybrid multibit adder is used to add two multi bit numbers or vectors together to get the final result of the squarer functional block.

Optimized Bitvector Generation

Figure 3:
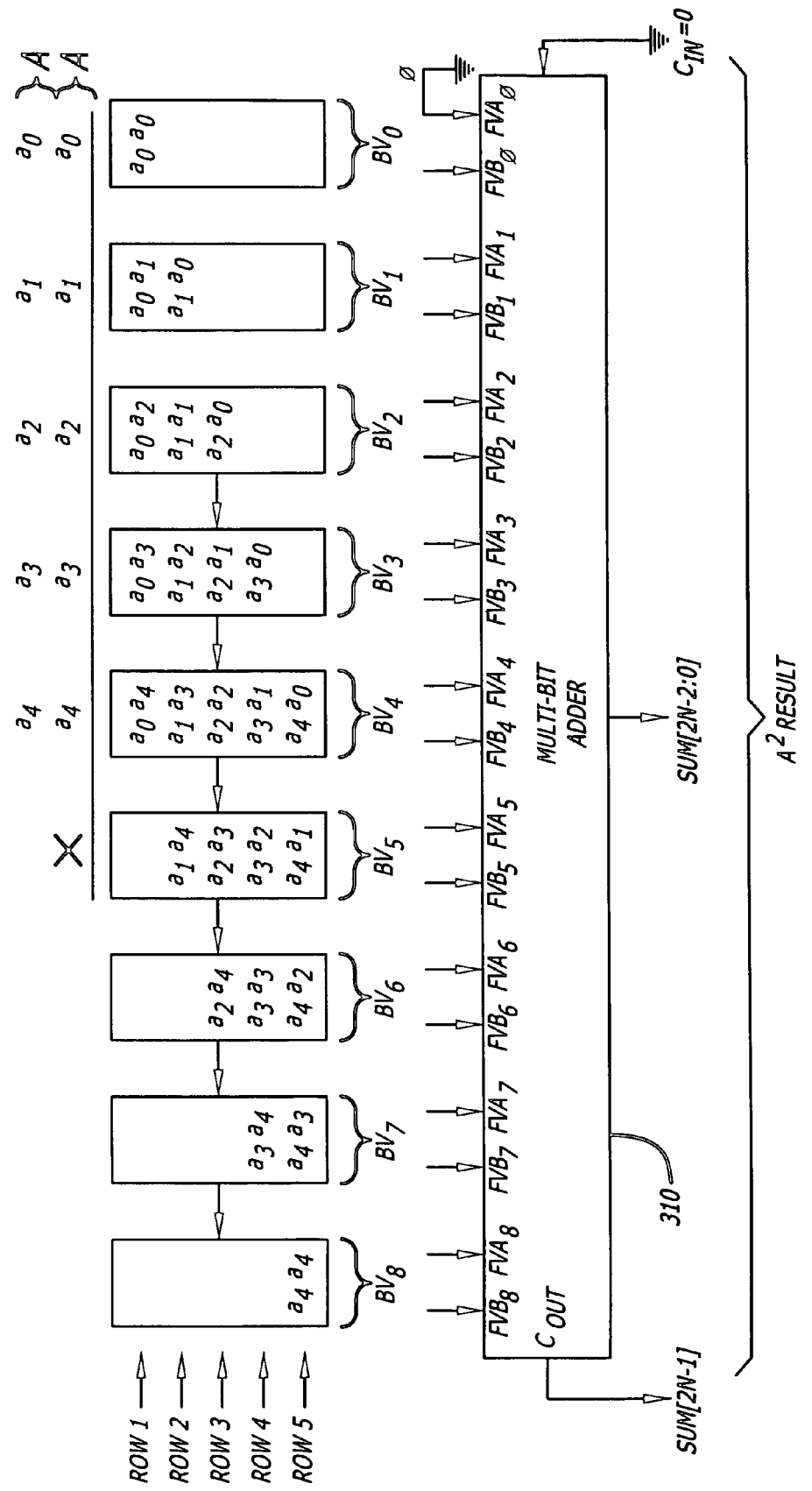
FIG. 3 is a diagram illustrating squaring of a five bit number/vector, the formation of partial products, BitVectors, and the two final vectors that are added together in a multibit adder to obtain a resultant squared product.

Referring now to FIG. 3, squaring of vector A, a five-bit number, is illustrated as an exemplary function of a squarer functional block. In the squaring of binary numbers, the mathematics may be similarly performed to traditional long handed multiplication of a number with itself. In Boolean algebra of binary bits, multiplication of one bit by another bit is a 2-input AND operation that can be performed by a 2-input AND logic gate.

For the squarer, we may define a BitVector for the bit as a set including the partial-product bits belonging to the $i^{th}$ bit. Let us consider an example of a 2 bit squarer first, which multiplies $\{a_1, a_0\}$ by $\{a_1, a_0\}$. In that case, the BitVectors are $BV_0=\{a_0 \cap a_0\}$; $BV_1=\{a_1 \cap a_0, a_0 \cap a_1\}$; and $BV_2=\{a_1 \cap a_1\}$ where $\cap$ represents a Boolean 2-input AND function. BitVectors can be similarly defined for any width of squarer. For example, in an n-bit squarer there are (n+n)−1 or 2n−1 BitVectors that can be defined.

The generation of BitVectors (block 502) is now described. In the exemplary squaring illustrated in FIG. 3, vector A includes five bits $a_0$ through $a_4$. A 5-bit by 5-bit multiplication has (5+5)−1 or nine BitVectors $BV_0$-$BV_8$ that can be defined. The multiplication of vector A with itself forms five rows and nine columns.

In Row 1, bit $a_0$ of vector A is multiplied with each bit $a_0$ through $a_4$ of vector A. In Row 2, shifted one bit to the left, bit $a_1$ of vector A is multiplied with each bit $a_0$ through $a_4$ of vector A. In row 3, shifted two bits to the left, bit $a_2$ of vector A is multiplied with each bit $a_0$ through $a_4$ of vector A. In Row 4, shifted three bits to the left, bit $a_3$ of vector A is multiplied with each bit $a_0$ through $a_4$ of vector A. In Row 5, shifted four bits to the left, bit $a_4$ of vector A is multiplied with each bit $a_0$ through $a_4$ of vector A.

Each of the columns generated by the bit multiplication of the bits of the vector A and bit shifting in the rows is referred to as a BitVector (BV). For the example squaring illustrated in FIG. 3, nine BitVectors $BV_0$ through $BV_8$ are formed. In the first column, the multiplication of bit $a_0$ and bit $a_0$ together forms one partial product as the BitVector $BV_0$. In the second column, the multiplication of bit $a_1$ with bit $a_0$ and the multiplication of bit $a_0$ and $a_1$ together forms two partial products of the BitVector $BV_1$. In the third column, the multiplication of bit $a_2$ with bit $a_0$, the multiplication of bit $a_1$ with bit $a_1$, and the multiplication of bit $a_0$ and bit $a_2$ together forms three partial products of the BitVector $BV_2$ as illustrated. The other BitVectors $BV_3$-$BV_8$ include the partial products as shown in FIG. 3 for the exemplary squaring.

To generalize the BitVector generation, assume that we want to square a multiple bit signal/number/vector "A" having n-bits together with its individual bits represented as follows: Vector A: $a_{n-1}$ $a_{n-2}$ ... $a_2$ $a_1$ $a_0$ In this case, we generate n rows of partial products and each row would have n-elements so that there were 2n−1 BitVectors. As further discussed herein, every bit of a partial product is generated by a 2-input AND function or 2-input AND gate. Thus, "AND($a_i$, $a_j$)" used herein indicates a two-input AND operation between bits $a_i$ and $a_j$.

In this example, the partial products in row 1 would be: AND($a_{n-1}$, $a_0$) AND($a_{n-2}$, $a_0$) ... AND($a_2$, $a_0$) AND($a_1$, $a_0$) AND($a_0$, $a_0$)

The partial products in row 2 would be (shifted left by 1-bit):
AND($a_{n-1}$, $a_1$) AND($a_{n-2}$, $a_1$) . . . AND($a_2$, $a_1$) AND($a_1$, $a_1$) AND($a_0$, $a_1$)

The partial products in row 3 would be (shifted left by 2-bits):
AND($a_{n-1}$, $a_2$) AND($a_{n-2}$, $a_2$) . . . AND($a_2$, $a_2$) AND($a_1$, $a_2$) AND($a_0$, $a_2$)

The partial products in row 4 would be (shifted left by 3-bits):
AND($a_{n-1}$, $a_3$) AND($a_{n-2}$, $a_3$) . . . AND($a_2$, $a_3$) AND($a_1$, $a_3$) AND($a_0$, $a_3$)

The partial products in row 5 would be (shifted left by 4-bits):
AND($a_{n-1}$, AND($a_{n-2}$, $a_4$) . . . AND($a_2$,$a_4$) AND($a_1$, $a_4$) AND ($a_0$, $a_4$)

The partial products in other rows are similarly formed with additional bit shifts left wherein the last row n would be (shifted left by n−1 bits):
AND($a_{n-1}$, $a_{n-1}$) AND($a_{n-2}$, $a_{n-1}$) . . . AND($a_2$, $a_{n-1}$) AND($a_1$, $a_{n-1}$) AND($a_0$, $a_{n-1}$)

The foregoing describes how n-rows of partial products get generated to form (2n−1) BitVectors for a squarer functional block. Without reduction, a total (n*n or $n^2$) number of 2-input AND gates are used in the generation of all the partial products for squaring the multi-bit vector/number/signal A.

As discussed previously, multiplication of one bit by another bit using Boolean algebra of binary bits is a 2-input logical AND operation that can be performed by a 2-input AND gate. Without any reduction of the BitVectors, there are 25 partial products that require 25 two-input AND gates in the case of the five-bit vector A illustrated in FIG. 3. To synthesize the logic for the exemplary squaring function, it is desirable to reduce the number of partial products by optimizing and then reducing the BitVectors to reduce the size of the final adder functional block and reduce the delay in generating a final result of the squaring function. Optimizing and reducing the BitVectors conserves silicon area and can reduce the delay in the data path of an integrated circuit chip.

In order to reduce the size of the final adder used in the squarer mathematical operation, the BitVectors can be optimized with selected partial product terms and then BitVector reduction can be performed to reduce the terms of each BitVector down to a single result or two numbers that can be added by the multi bit adder 310. The two final numbers/vectors are referred to as final vector A (FVA) and the final vector B (FVB). In the case of the squaring illustrated in FIG. 3, final vector A has nine bits FVA0-FVA8 and final vector B has nine bits FVB0-FVB8 coupled into the multi bit adder 310.

BitVector BV0 is a special case with only one final resultant bit FVB0 so that FVA0 is coupled to logic zero, (such as by being coupled to ground), as is the carry input $C_{IN}$. Typically with BitVectors BV1 and BV0 generating no more than two values, there is no need to reduce those further. However BitVector $BV_2$, for example, includes three terms that may be reduced down to two numbers that can be added together by the one multi bit adder 310.

As discussed further herein below, BitVectors BV3, BV2, BV1, and BV0 can be optimized down to a logical expression that generates a single sum bit, the result, without being added by an adder such as the multi-bit adder 310. Other BitVectors can be reduced down to two sum values that may be added together by one hybrid multi bit adder, with carry output bits from one BitVector that may be coupled to the next highest BitVector. For example, BitVector $BV_4$ has five terms that are to be reduced down to two bits or signals and a carry out bit.

The carry out bit of BitVector $BV_4$ is coupled into BitVector $BV_5$. As another example, consider BitVector $BV_5$ that includes four partial product terms or elements. BitVector $BV_5$ also receives carry bits or signals from BitVector $BV_4$ that need to be summed together with the partial product terms to generate the final resultant output. Additionally, multiple intermediate sum bits may be generated in reducing a BitVector down to two values. Thus, the BitVectors may be considered to further include elements of intermediate sum bits of previously reduced partial product terms and carry bits from a prior BitVector.

Alternatively, the built-in symmetric nature of the squarer allows an optimization method of BitVectors such that the number of partial-products can generally be reduced by approximately fifty percent. The central idea in this method of BitVector optimization is to combine $\{a_i \cap a_j, a_j \cap a_i\}$ into $2 \times \{a_i \cap a_j\}$. Then, the expression $2 \times \{a_i \cap a_j\}$ can be shifted left by one bit position into the next significant bit as $\{a_i \cap a_j\}$. To explain this in the context of BitVectors, let us assume we have the following BitVectors:

$$\text{BitVector}_i = \{\ldots, a_i \cap a_j, a_j \cap a_i\}$$

$$\text{BitVector}_{i+1} = \{\ldots, a_{i+1} \cap a_j, a_j \cap a_{i+1}\}$$

$$\text{BitVector}_{i+2} = \{\ldots\}$$

Applying the above-mentioned simplification technique, the BitVectors may be simplified to look like:

$$\text{BitVector}_i = \{\ldots\}$$

$$\text{BitVector}_{i+1} = \{\ldots, a_i \cap a_j\}$$

$$\text{BitVector}_{i+2} = \{\ldots, a_{i+1} \cap a_j\}$$

This BitVector optimization method helps reduce both the timing delay and the area or footprint of the squarer.

Figure 4:
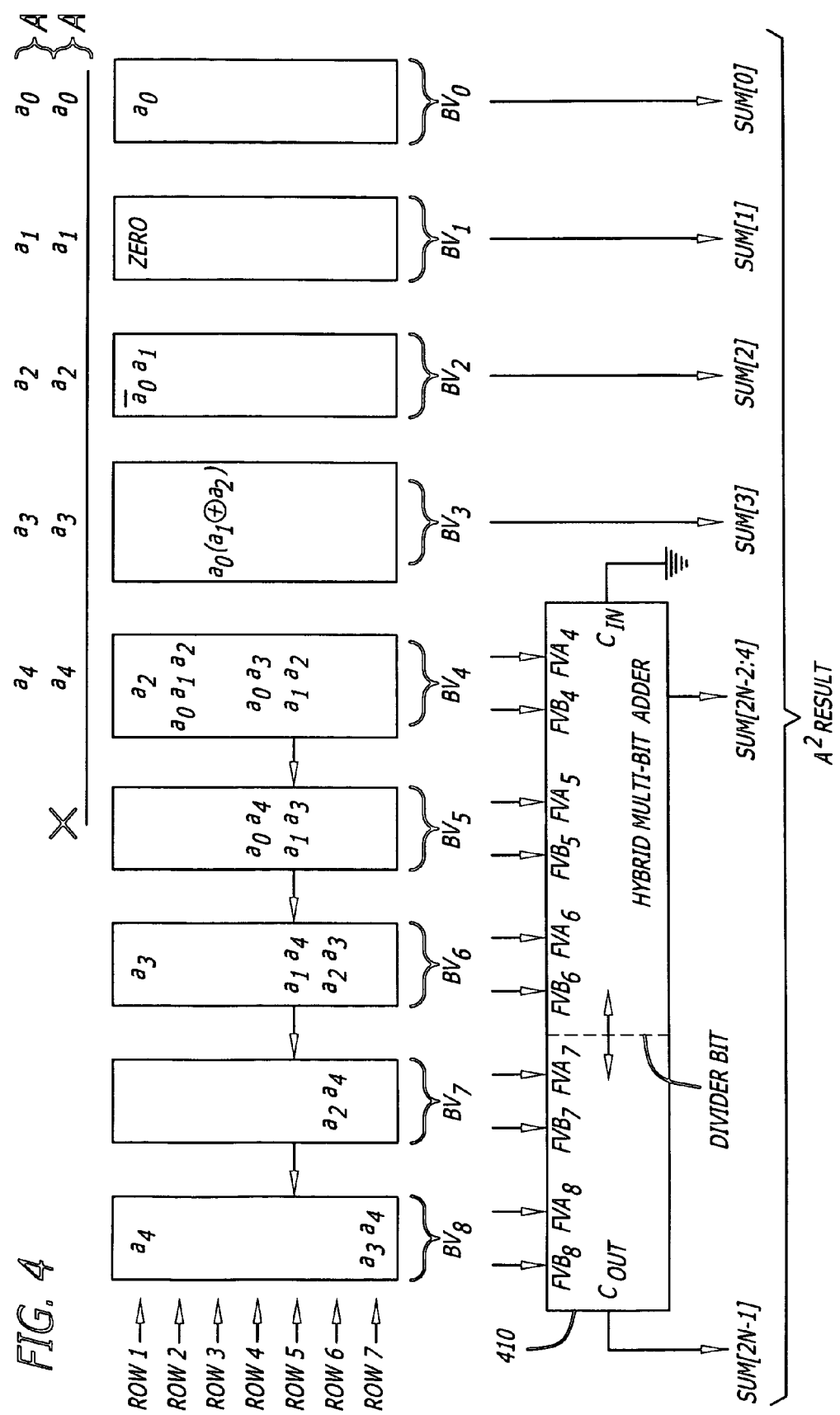
FIG. 4 is a diagram illustrating BitVector optimization and a hybrid multibit adder for the squaring of a five bit number/vector illustrated in FIG. 3.

Referring now to FIGS. 3 and 4, FIG. 4 illustrates the BitVector optimization of the squaring of the exemplary five-bit vector A from that of FIG. 3. As discussed previously each of the BitVectors BV0 through BV3 can be specially simplified or optimized down to a single bit, bits sum[0] through sum[3] respectively, without having to be added by a hybrid multibit adder 410, as is illustrated in FIG. 4.

Figure 6:
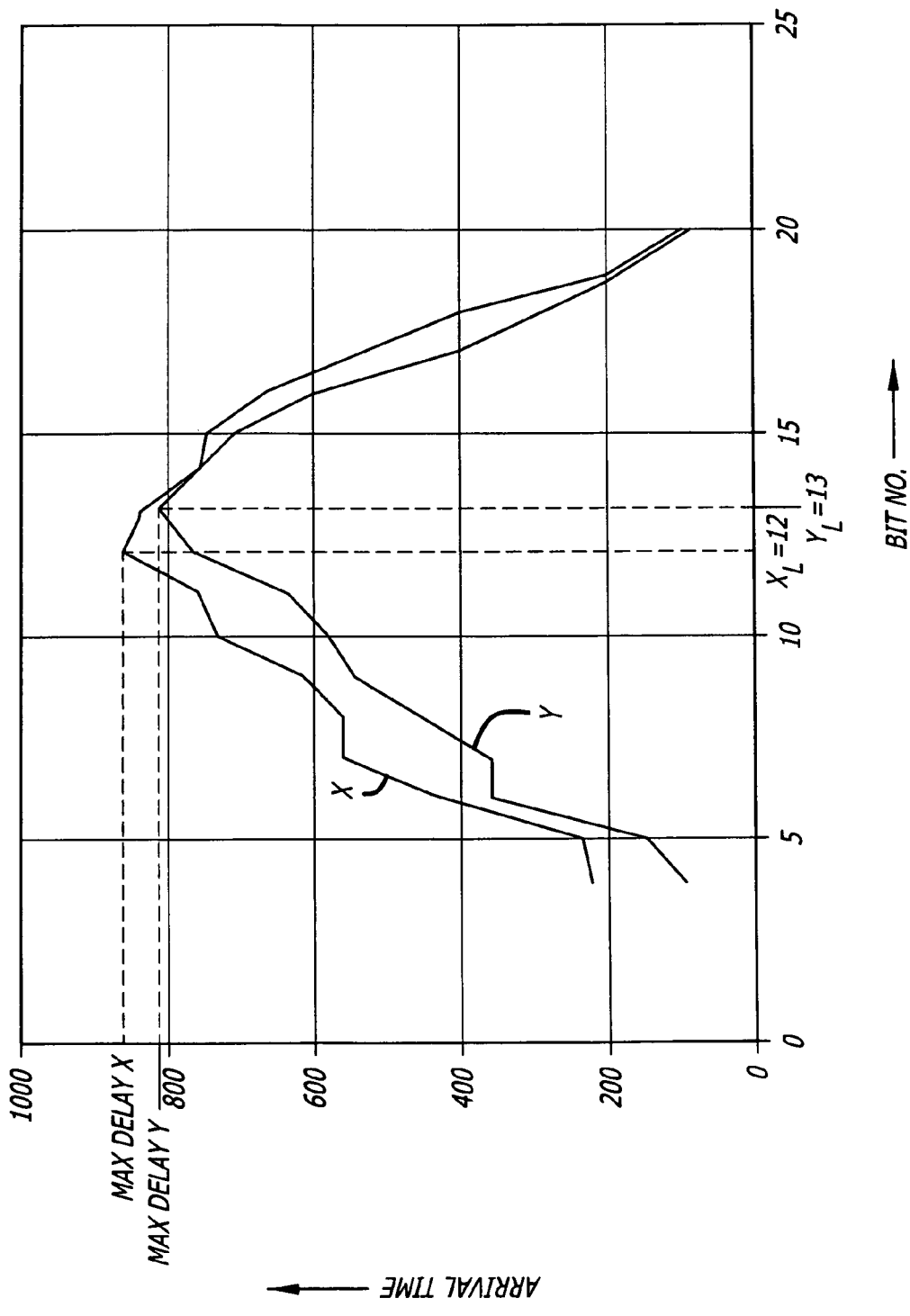
FIG. 6 is an exemplary graph of arrival times versus bit numbers of input bits to an adder in an 11 bit squarer functional block.

The hybrid multibit adder 410 has a dividing line established by a DividerBit to match the type of adders that may be used with the expected delay of the Final vector bits FVA and FVB from each of the BitVectors BV4 through BV8. FIG. 6 illustrates an exemplary pattern of arrival times for the final vector bits FVA and FVB depending upon their bit number significance. Generally, the final vector bits FVA and FVB in the middle appear to be slower than the final vector bits FVA and FVB at either end, near the LSB or the MSB.

In BitVector BV0, $a_0 a_0$ may be simplified to $a_0$ as logically ANDing a literal with itself generates the literal. Regardless of the bit width, $a_0$ is always the final Sum[0] bit output of a squarer.

In BitVector BV1, $a_0 a_1$ added together with $a_1 a_0$ is the same as 2 times $a_0 a_1$. Thus, it can be seen that the sum[1] bit is always a logical zero because 2 times $a_0 a_1$ is either zero or two. If two, there is a carry to the next significant bit with a zero sum bit output. Thus, the sum[1] bit is set to logical zero and the partial product $a_0 a_1$ may be carried over to the BitVector BV2. Note that any time there is a matching pair of partial products in a given BitVector, the partial product can be moved to the BitVector of the next significant bit.

In our notion of BitVector, that translates to the following equations:

BitVector $BV0=\{a_0\}$

BitVector $BV1=\{ZERO\}$

For an n-bit squarer where n is greater than or equal to four, three more significant BitVectors can be simplified in the optimization process. In the optimization process, the following identity equation may be used:

$a_i+a_i \cap a_j = a_i \cap \sim a_j + 2*a_i \cap a_j$ (where $\sim a_j$ denotes the compliment or inversion of $a_j$)

For any n-bit squarer (where n≥4), the partial product elements in the low order BitVectors (BV2-BV4) can be analyzed and the following BitVector equations can be formulated:

BitVector $BV2=\{a_1, a_0 \cap a_1\}$

Simplifies to => $\{\sim a_0 \cap a_1\}$

BitVector $BV3_3=\{a_0 \cap a_1, a_0 \cap a_2\}$

Simplifies to => $\{a_0 \cap (a_1 \oplus a_2)\}$

BitVector $BV4=\{a_0 \cap a_4, a_1 \cap a_3, a_2 \cap a_2, a_3 \cap a_1, a_4 \cap a_0\}$ Simplifies to => $\{a_2, a_0 \cap a_3, a_1 \cap a_2, a_0 \cap a_1 \cap a_2\}$ In the simplification of these BitVectors, we are also sending a value to the next higher significant BitVector. In BitVector BV2, the matching pair of partial products $a_0a_2$ and $a_2a_0$ can be moved to the next significant BitVector BV3 as a single partial product. The partial product $a_1a_1$ simplifies to $a_1$ such that sum[2] could be a simple sum of $a_1$ and $a_0a_1$ carried over from the prior bit. However, BitVector BV2 can be further simplified by equations $a_1+a_0a_1=a_1+2a_0a_1-a_0a_1$. The partial product term $2a_0a_1$ can be moved to the next significant BitVector, BV3, leaving $a_1-a_0a_1$. Factoring out $a_1$, we see the equation becomes $a_1 \times (1-a_0)$. Now $(1-a_0)$ is equivalent to the compliment of $a_0$ or $\sim a_0$. Thus with multiplication of bits being an AND operation, the BitVector BV2 simplifies down a single AND gate to perform $\sim a_0 a_1$ as indicated above for the resultant output of the sum[2] bit of a squarer functional block.

In BitVector BV3, the two matching pairs of partial products ($a_0a_3$ and $a_3a_0$) and ($a_1a_2$ and $a_2a_1$) can be moved to the next significant BitVector BV4 as respective single partial products. That leaves the partial product terms $a_0a_2$ and $a_0a_1$ being added together in BitVector BV3 carried over from the lower significant BitVector BV2. To further simplify BV3, the partial product term $a_0a_1a_2$ can be added to next higher order BitVector BV4 and $2a_0a_1a_2$ can be subtracted from the sum or the partial product terms $a_0a_2$ and $a_0a_1$. That is, sum[3]=$a_0a_2+a_0a_1-2a_0a_1a_2$ which further reduces to $(a_0a_2-a_0a_1a_2)+(a_0a_1-a_0a_1a_2)=a_0a_2(1-a_1)+a_0a_1(1-a_2)=a_0a_2\sim a_1+a_0a_1\sim a_2$ that can be further reduced to $a_0(a_2 \sim a_1 + a_1 \sim a_2)$. The quantity $(a_2 \sim a_1 + a_1 \sim a_2)$ is an exclusive-or (XOR) function so that the sum[3] bit of the BitVector BV3 can be further simplified to the logical expression $a_0(a_1 \oplus a_2)$ that requires one exclusive-OR (XOR) gate and one AND gate.

In BitVector BV4, the two matching pairs of partial products ($a_0a_4$ and $a_4a_0$) and ($a_1 a_3$ and $a_3a_1$) can be moved to the next significant BitVector BV5 as respective single partial products. The partial product term $a_2a_2$ simplifies down to $a_2$ in BitVector BV4. Recall that the partial product terms $a_0a_3$, $a_1a_2$, and $a_0a_1a_2$ were carried over into BitVector BV4 from the lower significant BitVector BV3. Thus, the terms $a_2$, $a_0a_3$, $a_1a_2$, and $a_0a_1a_2$ remain to be further reduced in BitVector BV4 as illustrated in FIG. 4.

With BitVectors BV0 through BV4 generated in the foregoing manner for the squarer, the remaining (2n-6) BitVectors can be generated by an algorithm as there is a pattern to the simplified partial product terms for the optimized even and odd BitVectors. The simplified partial product terms may only need a 2-input AND operation provided by a 2 input AND gate. To illustrate the pattern, we continue describing the BitVector generation for the exemplary 5 bit squarer illustrated in FIGS. 3 and 4.

In odd BitVector BV5, the two matching pairs of partial products ($a_1a_4$ and $a_4a_1$) and ($a_2a_3$ and $a_3a_2$) can be moved to the next significant BitVector BV6 as respective single partial products. Recall that the partial product terms $a_0a_4$ and $a_1a_3$ were carried over into BitVector BV5 from the lower significant BitVector BV4. Thus, the terms $a_0a_4$ and $a_1a_3$ remain to be further reduced in BitVector BV5 as illustrated in FIG. 4.

In even BitVector BV6, the matching pairs of partial products ($a_2a_4$ and $a_4a_2$) can be moved to the next significant BitVector BV7 as a single partial product. The partial product term $a_3a_3$ simplifies down to $a_3$ in even BitVector BV6. Recall that the partial product terms $a_1a_4$ and $a_2a_3$ were carried over into BitVector BV6 from the lower significant BitVector BV5. Thus, the terms $a_3$, $a_1a_4$, and $a_2a_3$ remain to be further reduced in BitVector BV6 as illustrated in FIG. 4.

In odd BitVector BV7, the matching pairs of partial products ($a_3a_4$ and $a_4a_3$) can be moved to the next significant BitVector BV8 as a single partial product. Recall that the partial product term $a_2a_4$ was carried over into BitVector BV7 from the lower significant BitVector BV6. Thus, the term $a_2a_4$ remains to be further reduced in BitVector BV7 as illustrated in FIG. 4.

In even BitVector BV8, the last BitVector in a 5-bit squarer, there are no matching pairs of partial products that are to be moved up to a next significant BitVector as a single partial product. The partial product term $a_4a_4$ simplifies to $a_4$ in even BitVector BV8. Recall that the partial product term $a_3a_4$ was carried over into BitVector BV8 from the lower significant BitVector BV7. Thus, the terms $a_4$ and $a_3a_4$ remain to be further reduced in BitVector BV8 as illustrated in FIG. 4.

Note that in the even BitVectors BV6 and BV8, the single bit terms $a_3$ and $a_4$ are generated. Between row 4 and row 7, partial products are placed into each BitVector along a diagonal of a four by four matrix such that the sum of the indexes of the bits is equal to the row number. Between each BitVector, from BitVector BV4 to BitVector BV8, there is a carry bit from one BitVector to the next that needs to be considered in the reduction of the BitVectors in FIG. 4.

To generalize, an algorithm for BitVector generation is presented below for an n-bit squarer to form 2n-1 BitVectors.
------- BitVector Generation Algorithm Begins ------
// Initialize all (2n-1) BitVectors to NULL
for (i=0 to (2n-2))
begin
   BitVector$_i$={NULL}
end
// Utilize the special simplification technique for 5 LSB BitVectors (as described previously)
BitVector$_0$={$a_0$}
BitVector$_1$={ZERO}
BitVector$_2$={$\sim a_0 \cap a_1$}
BitVector$_3$={$a_0 \cap (a_1 \oplus a_2)$}
BitVector$_4$={$a_2, a_0 \cap a_3, a_1 \cap a_2, a_0 \cap a_1 \cap a_2$}
// Compute BitVectors with even index (for example, BitVector$_6$, BitVector$_{14}$ etc.)

```
for (k=3 to (n-1))
begin
    BitVector_{2k}={a_k}
    for (p=0 to (k-1))
    begin
        if ((p<n) AND ((2k-1-p)<n)) then
            BitVector_{2k}={BitVector_{2k}, a_p∩a_{(2k-1-p)}}
    end // for
end // for
// Compute BitVectors with odd index (for example, BitVector_9, BitVector_13 etc.)
for (k=2 to (n-2))
begin
    for (p=0 to (k-1))
    begin
        if ((p<n) AND ((2k-p)<n)) then
            BitVector_{2k+1}={BitVector_{2k+1}, a_p∩a_{(2k-p)}}
    end // for
end // for
return all (2n-1) BitVectors
------- BitVector Generation Algorithm Ends ------
```

Figure 8A:
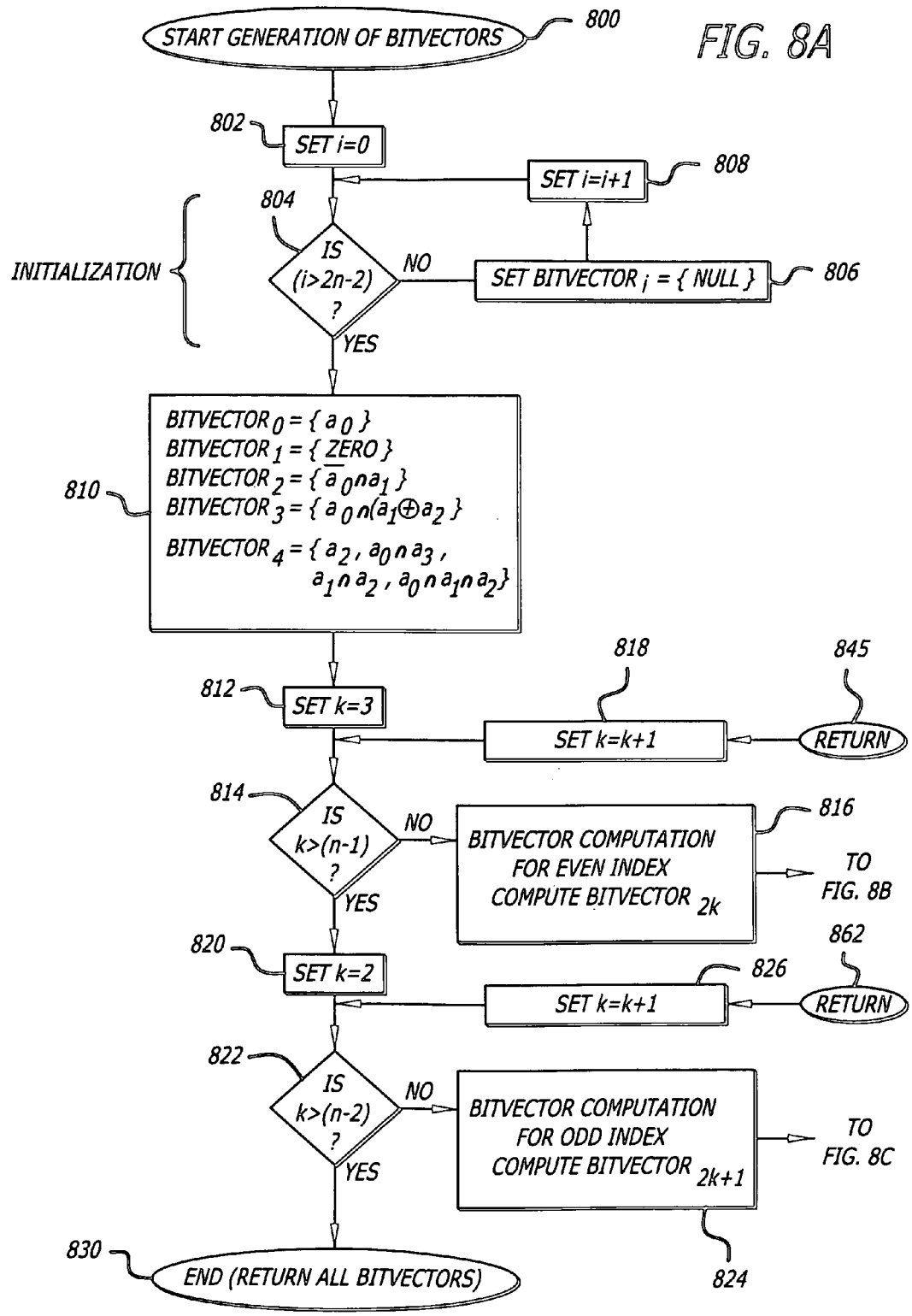
FIGS. 8A-8C are flow charts of a method of BitVector generation performed by one or more embodiments of the invention.
Figure 8B:
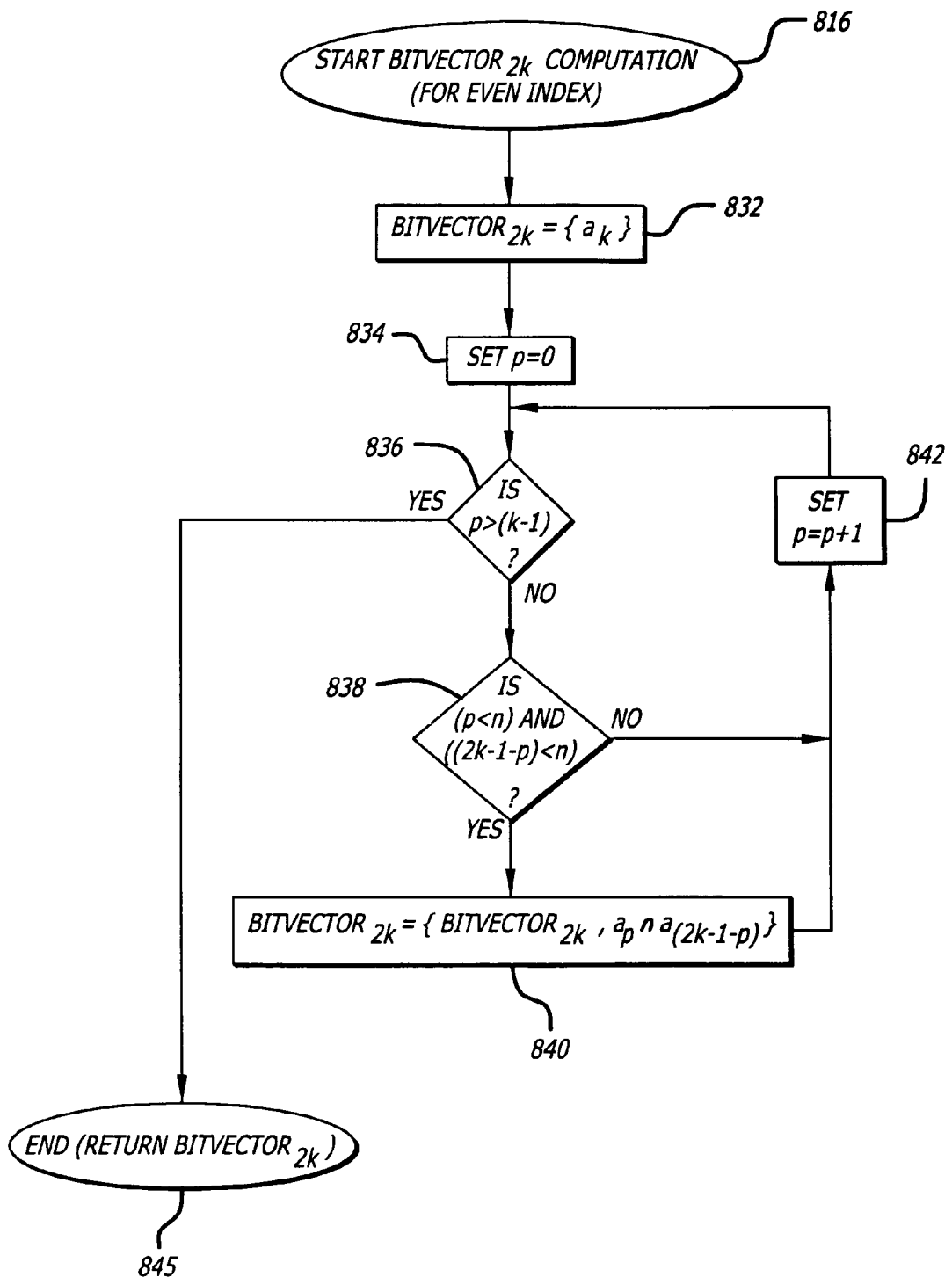
Figure 8C:
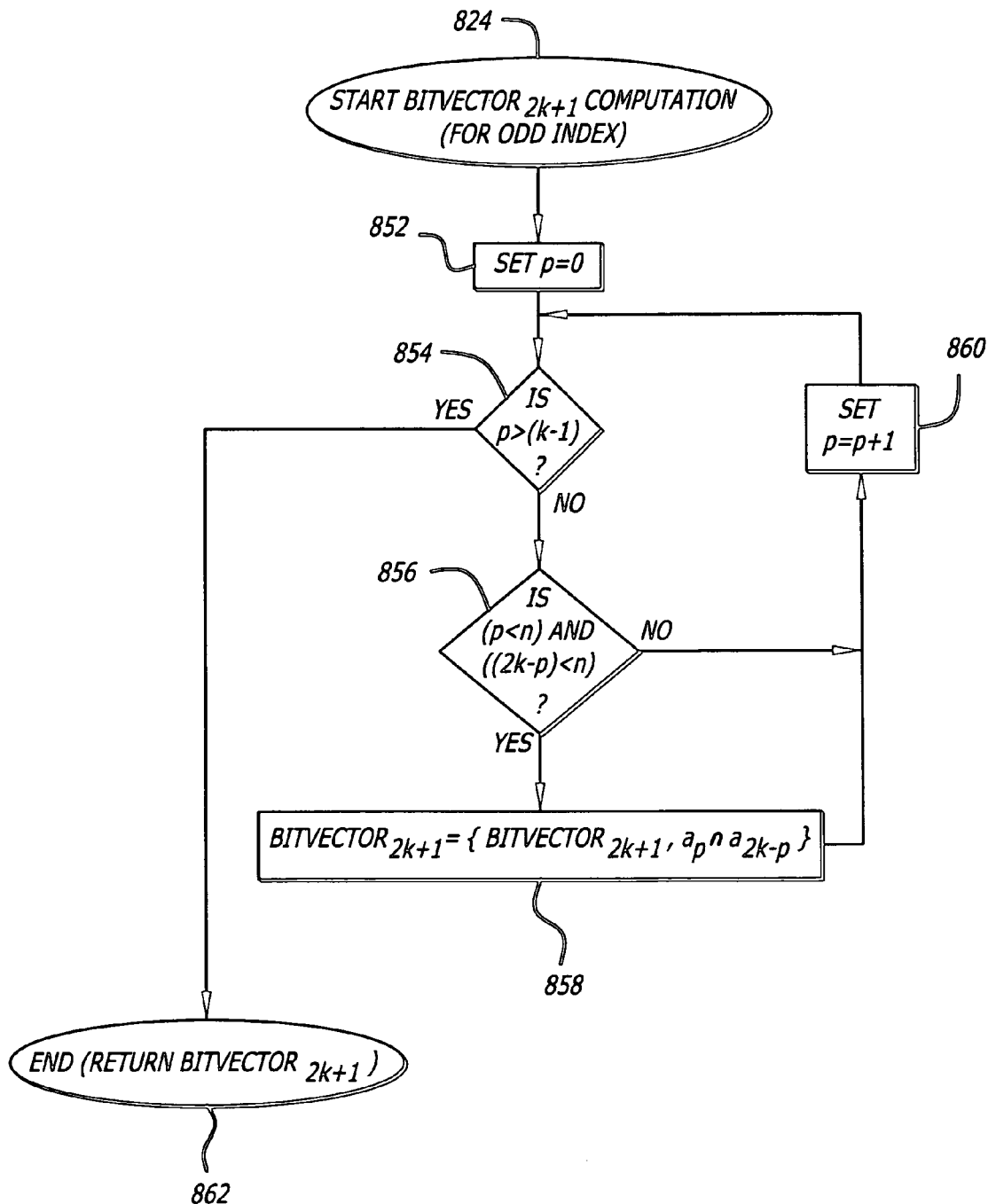

FIGS. 8A-8C illustrate this algorithm in flow chart form. FIG. 8A illustrates a flowchart to generate all of the 2n−1 BitVectors. FIG. 8B illustrates a flowchart to generate a BitVector with an even index, an even BitVector. FIG. 8C illustrates a flowchart to generate a BitVector with an odd index, an odd BitVector.

The flowchart of FIG. 8A may use the flowcharts illustrated in FIGS. 8B and 8C one or more times to generate a complete set of BitVectors for a squarer functional block in response to the bit width (n-bits) of vector A that is to be squared into the $A^2$ Result. After BitVectors BV0 through BV4 are generated by block 810, BitVectors for the even indexes greater than 4 are generated, if any. Then, the BitVectors with odd indexes greater than 4 are generated, if any.

Initially, decision blocks 814 and 822 respectively determine if there are even BitVectors and odd BitVectors more significant than BitVector BV4 in response to the number of bits n in vector A. That is, if the number of bits n in vector A is only 3 then only BitVectors BV0 through BV4 are to be generated by block 810 in FIG. 8A. In this case, the settings for k at blocks 812, 820 and the decision blocks 822 skip any further BitVector generation. Otherwise, decision block 814 determines if there are any even BitVectors greater than BitVector BV4 that need terms generated. Decision block 822 determines if there are any odd BitVectors greater than BitVector BV4 that need terms generated.

Referring now to FIG. 8A, at block 800 the generation of BitVectors begins and then goes to block 802 to initialize a complete set of 2n−2 BitVectors for the squarer. At block 802, an index variable i is set to 0. Then at block 804 determination is made if index i is greater than 2n−2 such that all the BitVectors for the squarer have been generated. If not, then the method goes to block 806. If all the BitVectors have been generated then the method goes to block 810.

At block 806, a single BitVector_i is defined with an initial set of terms equal to a null set. The terms of BitVector_i will be generated later in the process. The method then goes to block 808. At block 808, the index i is incremented by setting it equal to i+1 in order to prepare to generate the next more significant BitVector. The method then returns to decision block 804. Once again a determination is made if index i is greater than 2n−2 such that all the BitVectors for the squarer have been generated.

During the initialization of the complete set of BitVectors, the method loops around through blocks 804, 806, and 808 until at decision block 804 it is determined that the index i is greater than 2n−2. Recall that the value of n is the number of bits in the vector A that is to be squared. So if at decision block 804 it is found that index bit i is greater than 2n−2, then the process moves to block 810 to begin generating the terms of the BitVectors.

At block 810, optimized BitVectors BV0 through BV4 are generated as was previously discussed in great detail with reference to FIG. 4. BitVectors BV0 through BV3 have a single term or expression that directly generate their respective sum bit. BitVector BV0 is set to the term $a_0$. BitVector BV1 is set to the term logic zero. BitVector BV2 is set to the partial product $\sim a_0 a_1$, $(\sim a_0 \cap a_1)$, or the equivalent of the logical expression of not $a_0$ AND $a_1$. BitVector BV3 is set to the logical expression of $a_0 \cap (a_1 \oplus a_2)$ where $a_1$ and $a_2$ are exclusively ORed together and then logically ANDed with the term $a_0$. BitVector BV4 is set to include a set of four terms ($a_2$; $a_0 \cap a_3$; $a_1 \cap a_2$; $a_0 \cap a_1 \cap a_2$), bit $a_2$ of vector A; a first partial product $a_0 a_3$ where $a_0$ and $a_3$ are logically ANDed together; a second partial product $a_1 a_2$ where $a_0$ and $a_2$ are logically ANDed together; and a third partial product $a_0 a_1 a_2$ where $a_0$, $a_1$, and $a_2$ are logically ANDed together. With a set of four terms, BitVector BV4 is to be further reduced down to two terms to generate $FVB_4$ and $FVA_4$ as is further described below. The process then goes to block 812.

At block 812, an index bit k is initialized and set equal to 3 to prepare to generate the terms for the even BitVectors that are more significant than BitVector BV4 and then generate the terms for the odd BitVectors that are more significant than BitVector BV4. The process goes to block 814 to begin generating the terms for the even BitVectors that are more significant than BitVector BV4, if any.

At block 814, a determination is made if index k is greater than the quantity (n−1) such that no even BitVector need be generated. Recall that the value of n is the number of bits in vector A that is to be squared. If k is not greater than n−1, then an even BitVector with greater significance than BitVector BV4 needs its terms generated and the process goes to block 816. If k is greater than n−1, then no further even BitVectors with greater significance than BitVector BV4 need generation of the terms in their set and the process moves to block 820.

At block 816 with terms of an even BitVector BitVector_{2k} to be generated, BitVector computation for an even index is performed which is illustrated by the flowchart of FIG. 8B.

Referring now to FIG. 8B, all the terms of one even BitVector (BitVector_{2k}) are to be generated by the illustrated flowchart. Upon completing the generation of the terms for the one even BitVector, the process returns at block 845 to the flowchart illustrated in FIG. 8A. Then at block 818 illustrated in FIG. 8A, the index k is incremented by setting k equal to k+1 so that a next significant even BitVector may be generated. With the new index value k, block 814 in FIG. 8A determines if the next significant even BitVector requires generation or not in response to the number of bits in the vector A.

In FIG. 8B, even BitVector generation for an even index starts at block 816 and then goes to block 832.

At block 832, the term $a_k$ is added to the set of terms of BitVector_{2k}. With an initial setting of k equal to 3 at block 812, BitVector BV6 is generated to include the term $a_3$ at block 832. This step is repeated for other even BitVectors as k is incremented at block 818 of FIG. 8A and the flowchart of FIG. 8B is followed. After term $a_k$ is added to the set of terms of BitVector_{2k}, the method then goes to block 834.

At block 834, a new index p is initialized by setting p to zero in order to further generate terms of the even BitVector_{2k}. The method then goes to block 836.

At block 836, a determination is made if p is greater than the quantity (k−1). Block 836 determines whether or not the given BitVector$_{2k}$ is completely generated with all of its partial product terms. If the BitVector$_{2k}$ is not completely generated, the process goes to decision block 838. If the BitVector$_{2k}$ is completely generated, p is greater than k−1, then the process goes to block 845 and generation of the given BitVector$_{2k}$ is completed. The process then goes to block 818 of the flowchart in FIG. 8A where the index k is incremented by setting k equal to the quantity (k+1).

At block 838, a determination is made if p is less than n and if n is greater than 2k−1−p. Stated differently, if n is both greater than p and greater than the quantity 2k−1−p, then the process goes to block 840. If neither, (meaning that p is greater than or equal to n, or 2k−1−p is greater than or equal to n), then the process goes to block 842. Both inequalities assure that $a_n$ is not used as a term for a BitVector in block 840 for $a_p$ or $a_{(2k-1-p)}$, as the bits of vector A are numbered from 0 to (n−1). Additionally, these inequalities establish a range over which the index p is used to generate additional partial product terms for the even BitVector$_{2k}$.

At block 840, the BitVector$_{2k}$ is updated to include the prior BitVector$_{2k}$ terms and a new partial product term, $a_p a_{(2k-1-p)}$. In the new partial product term, $a_p a_{(2k-1-p)}$, $a_p$ is logically ANDed together with $a_{(2k-1-p)}$ as indicated by the ∩ symbol in FIG. 8B. After updating the set of terms of the BitVector$_{2k}$ with the new partial product term, $a_p a_{(2k-1-p)}$, the process goes to block 842.

At block 842, p is incremented by setting p to p+1 to prepare for the possible generation of a new term. With p incremented at block 842, the process returns to the decision block 836.

Again at decision block 836, a determination is made if the even BitVector$_{2k}$ is completely generated or not. If not, the process jumps to block 838 again to determine if p is a proper value to generate an additional new partial product term, $a_p a_{(2k-1-p)}$. If so, the process goes to block 840 to include the new partial product term using the incremented value of p. If p is not of a proper value to add an additional new partial product term, then the process jumps directly to block 842, bypassing block 840 without generating an additional term for the BitVector$_{2k}$. In this manner, the loop formed by blocks 836, 838, 840, and 842 is performed to increase the number of terms in the BitVector$_{2k}$.

At block 836, if the BitVector$_{2k}$ is completely generated then p is greater than the quantity (k−1) and then the process returns to block 845 of the flowchart illustrated in FIG. 8A.

In FIG. 8A at block 818, index k is incremented by setting k equal to k+1 so that a next significant even BitVector may be generated. The process then goes to block 814 with the new value of k.

At block 814, a determination is made if the next significant even BitVector requires generation or not as a function of the number of bits in vector A that is to be squared. If k is less than or equal to (n−1), n being the number of bits in vector A, then another even BitVector is generated by block 816 and the process of FIG. 8B. If k is greater than the quantity (n−1), n being the number of bits in vector A, then all the even BitVectors are generated and the BitVector generation method goes to block 820 in FIG. 8A to prepare to generate the terms for the odd BitVectors.

At block 820, with no further even BitVector needing terms generated, the index k is set equal to two (2) to prepare to generate the terms for the odd BitVectors that are more significant than BitVector BV4. The process then goes to block 822 to begin generating the terms for the odd BitVectors that are more significant than BitVector BV4, if any.

At block 822, a determination is made if k is greater than the quantity (n−2) such that no further odd BitVector need be generated. Recall that the value of n is the number of bits in vector A that is to be squared. If k is not greater than n−2, then an odd BitVector with greater significance than BitVector BV4 needs its terms generated and the process goes to block 824. If k is greater than n−2, then no further odd BitVectors with greater significance than BitVector BV4 need generation of the terms in their set and the process moves to block 830. That is, all BitVectors with odd indexes have been generated and the process goes to block 830 ending the generation of all the BitVectors for the squarer functional block.

At block 824 with terms of an odd BitVector (BitVector$_{2k+1}$) to be generated, BitVector computation for an odd index is performed which is illustrated by the flowchart of FIG. 8C.

Referring now to FIG. 8C, all the terms of one odd BitVector (BitVector$_{2k+1}$) are to be generated by the illustrated flowchart. Upon completing the generation of the terms for the one odd BitVector, the process returns at block 862 to the flowchart illustrated in FIG. 8A. Then at block 826 illustrated in FIG. 8A, the index k is incremented by setting k equal to k+1 so that a next significant odd BitVector may be generated. With the new index value k, block 822 in FIG. 8A determines if the next significant odd BitVector requires generation or not in response to the number of bits in the vector A.

In FIG. 8C, odd BitVector generation for an odd index starts at block 824 and then goes to block 852.

At block 852, a new index p value is initialized by setting p to zero in order to further generate terms of the odd BitVector$_{2k+1}$. The method then goes to block 854.

At block 854, a determination is made if p is greater than the quantity (k−1). Block 854 determines whether or not the given BitVector$_{2k+1}$ is completely generated with all of its partial product terms.

If the BitVector$_{2k+1}$ is not completely generated, the process goes to decision block 856. If the BitVector$_{2k+1}$ is completely generated, p is greater than k−1, then the process goes to block 862 and generation of the given BitVector$_{2k+1}$ is completed. The process then goes to block 826 of the flowchart in FIG. 8A where the index k is incremented by setting k equal to the quantity (k+1).

At block 838, a determination is made if p is less than n and if n is greater than 2k−p. Stated differently, if n is both greater than p and greater than the quantity 2k−p, then the process goes to block 858. If neither p is less than n nor if n is greater than 2k−p, (meaning that p is greater than or equal to n, or 2k−p is greater than or equal to n), then the process goes to block 860. Both inequalities assure that $a_n$ is not used as a term for a BitVector in block 858 for $a_p$ or $a_{(2k-p)}$, as the bits of vector A are numbered from 0 to (n−1). Additionally, these inequalities establish a range over which the index p is used to generate additional partial product terms for the odd BitVector$_{2k+1}$.

At block 858, a new partial product term is generated for the odd BitVector$_{2k+1}$. The BitVector$_{2k+1}$ is updated to include the prior odd BitVector$_{2k+1}$ terms and a new partial product term, $a_p a_{(2k-p)}$. In the new partial product term, $a_p a_{(2k-p)}$, $a_p$ is logically ANDed together with $a_{(2k-p)}$ as indicated by the ∩ symbol in FIG. 8C. After updating the set of terms of the odd BitVector$_{2k+1}$ with the new partial product term, $a_p a_{(2k-p)}$, the process goes to block 860.

At block 860, p is incremented by setting p to p+1 to prepare for the possible generation of a new term within the odd BitVector$_{2k+1}$. With p incremented at block 860, the process returns to the decision block 854.

Again at decision block 854, a determination is made if the odd BitVector$_{2k+1}$ is completely generated or not. If not, the process jumps to block 856 again to determine if p is a proper value to generate an additional new partial product term, $a_p a_{(2k-p)}$. If so, the process goes to block 858 to include another partial product term using the incremented value of p. If p is not of a proper value to add an additional new partial product term, then the process jumps directly to block 860, bypassing block 858 without generating an additional term for the given odd BitVector$_{2k+1}$. In this manner, the loop formed by blocks 854, 856, 858, and 860 is performed to increase the number of terms in the odd BitVector$_{2k+1}$.

At block 854, if the given BitVector$_{2k+1}$ is completely generated then p is greater than the quantity (k−1) and the process goes to block 862 and returns to block 862 of the flowchart illustrated in FIG. 8A where the process goes to block 826.

In FIG. 8A at block 826, index k is incremented by setting k equal to k+1 so that a next significant odd BitVector may be generated. The process then goes to block 822 with the new value of k.

At block 822, as discussed previously, a determination is made if the new value of k is greater than the quantity (n−2) such that no further odd BitVector need be generated. If k is not greater than n−2, then an odd BitVector with greater significance than the last needs its terms generated and the process goes to block 824. If k is greater than n−2, then no further odd BitVectors need generation and the process goes to block 830, since all BitVectors have been generated.

At block 830, the method of BitVector generation for the squarer functional block ends and the sets of terms of all the BitVectors is returned to further synthesize the logic of a squarer functional block.

Reduction of BitVectors

After generating the BitVectors, most of the BitVectors contain more than two elements. In reduction, we reduce each BitVector down to a maximum of two elements. Partial product reduction for each BitVector may be made to two final multi-bit vectors/numbers/signals (FVB, FVA) so that a final addition can be made to produce the final output of the squarer. Depending upon the expected delays or arrival times of the partial product terms (which is also a function of the input signals), the carry signals from the prior BitVector, and the intermediate sums of prior reduction within a BitVector, the reduction of the elements within a given BitVector may vary. The reduction of BitVectors (block 504) including the reduction of partial products terms is now described to reduce each BitVector to a maximum of two elements.

As we have explained in the previous section, the BitVectors BV0, BV1, BV2, and BV3 were optimized down to a single element or term. As a result, no further action is needed in reducing the terms of these four BitVectors down if they are optimized as previously discussed.

The partial products of the more significant 2n−5 BitVectors may be reduced by conventional means used in any multiplier, such as the reduction of partial products described in the "A suggestion for fast multiplier" by C. S. Wallace in the IEEE Transaction on Electronic Computers, EC-13(2): 1417, 1964. However, an enhanced tree-reduction technique may be used that is more suitable for reducing BitVectors.

For the more significant 2n−5 BitVectors of the squarer, a timing-driven approach of reducing the BitVectors may be used. This method is disclosed in our U.S. patent application Ser. No. 11/387,470, entitled "Timing Driven Synthesis of Sum-of-Product Functional Blocks", filed on Mar. 22, 2006 by Sabyasachi Das et al. which is incorporated herein by reference. This method selectively uses a combination of full adders (3:2 counters) and half adders (2:2 counters) in response to timing delays to reduce the partial products. In this algorithm, the timing profile of individual signals are used to select between using a half adder or a full adder. Previously it was often assumed that all input signals arrive at the input to a functional block at the same time. However, this rarely happens. Typically, the different bits of the input signals arrive at different times at the input of a squarer functional block. This BitVector reduction algorithm is designed to work seamlessly with any timing constraint. In this BitVector reduction method, opportunities to use half adders (2:2 counters) are sought out.

The equations for the Sum-bit of the two counters (full and half adders) are as follows:

$$\text{Sum} = a \oplus b \oplus c \text{ (for 3:2 counters-a full adder)}$$

$$\text{Sum} = a \oplus b \text{ (for 2:2 counters-a half adder)}$$

From these two equations, we can conclude that if the earliest arriving two signals (a and b) arrive at least one 2-input XOR gate-delay before the third signal (signal c), then we can improve the delay of the reduction tree by using a 2:2 counter (a half adder) instead of a 3:2 counter (a full adder). The usage of the 2:2 counter effectively reduces one element from the BitVector which can provide a faster reduction tree.

Additionally, this BitVector reduction algorithm considers the technology library of the standard cell. The fastest 2-input XOR cell from the standard cell library is identified and used as the delay for comparison in the BitVector reduction algorithm. This may ensure proper functioning of the BitVector reduction algorithm across different technology domains (e.g., 0.18 micron, 0.13 micron, and 0.09 micron).

------------ BitVector Reduction Algorithm for the 2n−1 BitVectors ------
// No further reduction of the 4 LSB BitVectors BV0 through BV3 is needed if optimized. Delay($\oplus$) is the delay of the fastest 2-input XOR gate in the technology library.
// Reduce the remaining 2n−5 BitVectors
for i=4 to (2n−1) do
   Compute arrival times for all the signals
   Let us denote Arr(a) as the arrival time of the signal a
Sort all the signals in the BitVector, according to their arrival time (in ascending order)
while BitVector$_i$ has more than 2 elements do
Select the three signals (a, b, c) with earliest arrival time
if Max(Arr(a), Arr(b))+Delay($\oplus$)<Arr(c) then
   Perform [2:2] reduction of signals a and b by using half-adders
Compute the arrival time of the resulting sum-bit and add that to the sorted list of elements of
   Bit Vector$_i$
Compute the arrival time of the resulting carry-bit and add that to the list of elements of
   BitVector$_{i+1}$
Remove signals a and b from the list of elements of BitVector$_i$
else
   Perform [3:2] reduction of signals a, b and c by using full-adders
Compute the arrival time of the resulting sum-bit and add that to the sorted list of elements of
   BitVector$_i$
Compute the arrival time of the resulting carry-bit and add that to the list of elements of
   BitVector$_{i+1}$ Remove signals a, b and c from the list of elements of BitVector$_i$;
end if
end while
end for
return all 2n−1 BitVectors;
each BitVector consisting of two or less elements
------------- End BitVector Reduction Algorithm for the 2n−1 BitVectors ------

For further details regarding this method of BitVector reduction, the reader is referred to our prior U.S. patent application Ser. No. 11/387,470, entitled "Timing Driven Synthesis of Sum-of-Product Functional Blocks", filed on Mar. 22, 2006 which has been incorporated herein by reference.

Hybrid Multibit Adder and DividerBit

Since the squarer circuit needs to present the final result in a single binary vector format, all the reduced BitVectors have to be added by a final adder circuit with carry propagation. After the creation and simplification of the BitVectors as described previously, they were reduced, but for BitVectors BV0 through BV3 which were optimized. In reduced form, each BitVector contains a maximum of two elements to be added by a final adder circuit with carry propagation.

To have a faster squarer functional block, it is desirable to use a fast technique of performing carry propagation addition. In high-frequency datapath designs, an adder with a parallel prefix computation methodology is a good choice. Two widely used algorithms with parallel prefix computation are described in "A Regular Layout for Parallel Adders" by R. P. Brent, H. T. Kung (BK), in IEEE Transaction on Computers, C-31(3): pages 260-264, 1982; and "A Parallel Algorithm for the Efficient Solution of a General Class of Recurrence Equations" by P. M. Kogge, H. S. Stone (KS), in IEEE Transaction on Computers, C-22(8), Pages 786-793, 1973. Both of these addition methods perform extensive computations which generate and propagate signals in a levelized fashion. In the Brent-Kung (BK) addition scheme, an n-bit adder has a delay of approximately (2 log$_2$n−2) levels and an area of approximately (2n−log$_2$n−2) cells. In the Kogge-Stone (KS) addition scheme, an n-bit adder has a delay of approximately (log$_2$n) levels and an area of approximately (n log$_2$ n+1−n) cells. These methods of addition can be combined into a hybrid multibit adder that considers the arrival times of input signals to design a fast hybrid multibit adder for a squaring functional block.

Figure 7C:
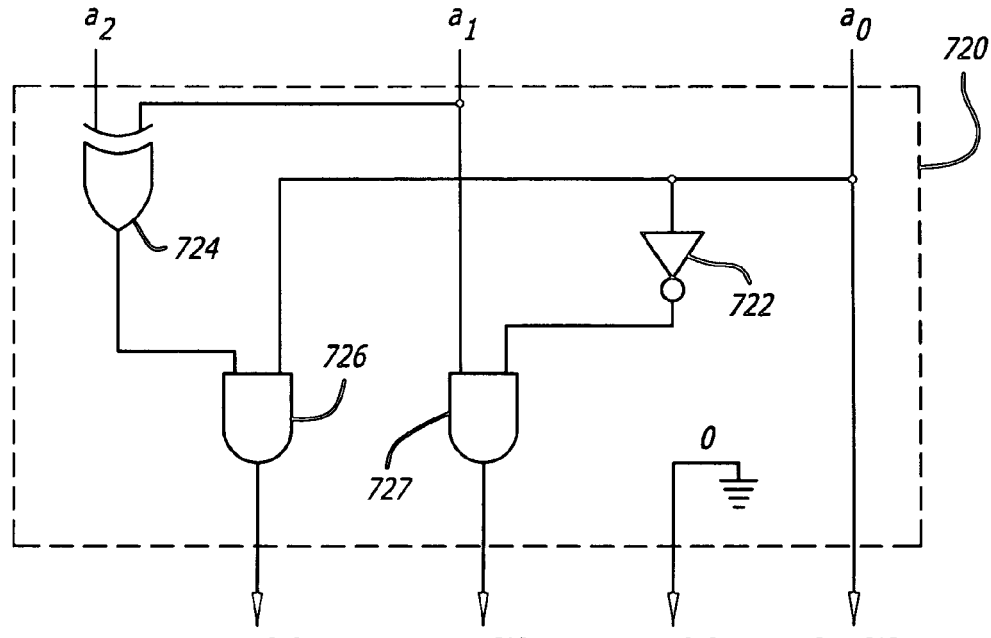
FIG. 7C is a logic diagram illustrating an exemplary combinational logic schematic of BitVector optimization logic.
Figure 7A:
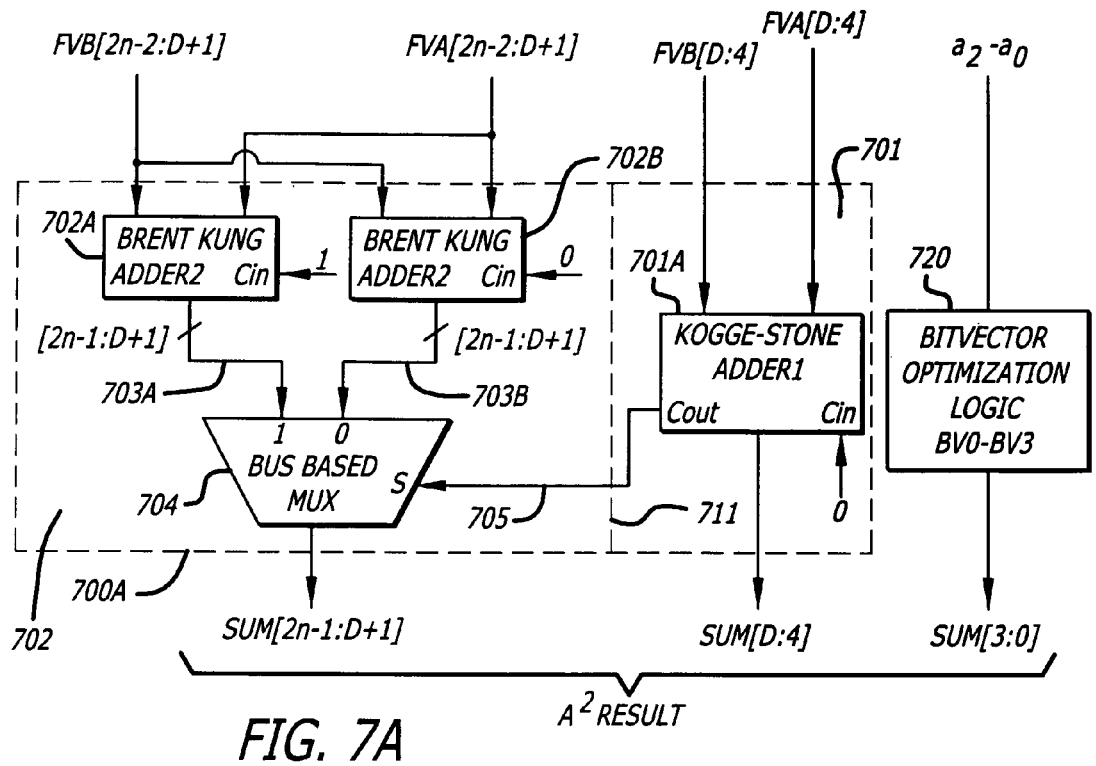
FIG. 7A is a functional block diagram illustrating a first embodiment of a hybrid multibit adder and BitVector optimization logic to generate a squared output result.

Referring now to FIG. 7A, a hybrid multibit adder 700A is illustrated. Together the BitVector optimization logic 720 for the BitVectors BV0-BV3 and the hybrid multibit adder 700A can generate the resultant output ("A$^2$ Result") of the squarer functional block. The hybrid multibit adder is split into two smaller-sized sub-adders. The DividerBit D is the bit number at which a partition is made between the two smaller-sized sub adders. The two smaller-sized sub-adders may be referred to as Adder1 701 and Adder2 702. The DividerBit D may be the maximum bit number in Adder1 701. The DividerBit D establishes a dividing line 711 between Adder1 701 and Adder2 702 in the hybrid multibit adder 700A. Given the number of bits in vector A being squared, the value of the DividerBit D sets the bit widths of each of Adder1 701 and Adder2 702 in the hybrid multibit adder 700A and may speed the carry delay path from Adder1 701 to Adder2 702.

Adder1 701 is an adder with an architecture to reduce the timing delay in the generation of its sum output bits sum[D:4] and its carry output 705. This is because the DividerBit D is selected to establish the dividing line 711 so that slower input bits of the final vectors FVA and FVB are coupled into the adder1 701. That is, it is expected that the bits of the final vectors FVA and FVB with the maximum arrival times are included in the FVA[D:4] and FVB[D:4] bits, in comparison with the other input bits of the final vectors FVA and FVB. This is so that the slower input bits in the final vectors FVA and FVB are matched to a faster adder.

Adder2 702 is an adder with an architecture to reduce area usage. This is because the DividerBit D is selected to establish the dividing line 711 so that faster input bits of the final vectors FVA and FVB are coupled into the Adder2 702. Faster input bits of the final vectors FVA and FVB, in comparison with the bits of the final vectors FVA and FVB with maximum arrival times, are matched to an area efficient adder that may take a longer period of time to generate its sum output bits sum[2n−2:D+1] and its carry output bit sum[2n−1]. That is, Adder2 702 differs from Adder1 701 in that Adder2 702 may be slower but uses less area.

Given the DividerBit D, Adder1 701 adds the least significant (k−3)-bits of the two operands (FVA and FVB) and produces the (D−3)-bits of the final sum output Sum[D:4] and a carry-out bit 705. The DividerBit may be considered to be a part of Adder1 701.

Given the DividerBit D, Adder2 702 adds the most significant (2n−2−D)-bits of the two operands (FVA and FVB) and one carry-in bit to produce the (2n−1−D) most significant bits of the final sum output Sum[2n−1:D+1].

In one embodiment of the invention, the hybrid multibit adder 700A includes a Kogge-Stone (KS) adder 701A, a first Brent-Kung (BK) adder 702B, a second Brent-Kung (BK) adder 702A, and a bus-based multiplexer 704 coupled together as shown. Given the bit width set by the DIVIDERBIT D, the BK adders 702A-702B are formed as described in "A Regular Layout for Parallel Adders" by R. P. Brent, H. T. Kung (BK), in IEEE Transaction on Computers, C-31(3): pages 260-264, 1982. Given the bit width set by the DIVIDERBIT D, the KS adder 701A is formed as described in "A Parallel Algorithm for the Efficient Solution of a General Class of Recurrence Equations" by P. M. Kogge, H. S. Stone (KS), in IEEE Transaction on Computers, C-22(8), Pages 786-793, 1973.

Each of the first Brent-Kung (BK) adder 702B and the second Brent-Kung (BK) adder 702A receive the same input data, FVB[2n−2:D+1] bits and FVA[2n−2:D+1] bits. However, the carry inputs to each differ. A carry input of zero is coupled into the first BK adder 702B while a carry input of one is coupled into the second BK adder 702A. As the carry inputs are constant, there is no waiting for any carry in bit to determine the sum output bits and the carry out bit of each adder. In this manner, both possible results are generated in advance of knowing what the actual carry input bit may be from the carry out bit 705 of the KS adder 701A. The bus-based multiplexer 704 is used to select which resultant sum out of each adder 702A-702B is to be selected as part of the A$^2$ result, in response to the carry out bit 705 from the KS adder 701B.

The bus 703A output from the second BK adder 702A includes sum bits and a carry out bit. Similarly, bus 703B from the first BK adder 702B includes sum bits and a carry out bit. Thus, each of the buses 703A-703B has the same bit width with respective bits, bit 2n−1 through bit D+1, being coupled as data inputs into the bus-based multiplexer 704.

The bus-based multiplexer 704 includes a select input S coupled to the carry out bit 705 of the KS adder 701A. A first data input (0) of the bus-based multiplexer 704 is coupled to the bus 703B. A second data input (1) of the bus-based multiplexer 704 is coupled to the bus 703A.

If the carry out bit 705 of the KS adder 701A is a logic zero, the multiplexer 704 selects bus 703B to pass through as the sum[2n−1:D+1] bits of the $A^2$ result. This corresponds to the carry input of logic zero coupled into the first BK adder 702B.

If the carry out bit 705 of the KS adder 701A is a logic one, the multiplexer 704 selects bus 703A to pass through as the sum[2n−1:D+1] bits of the $A^2$ result. This corresponds to the carry input of logic one coupled into the second BK adder 702A.

The KS adder 701A receives input data of FVB[D:4] bits and FVA[D:4] bits. The carry input bit of the KS adder 701A is set to logic zero. Thus, the KS adder 701A generates the sum[D:4] bits of the $A^2$ result. In this case, the remaining lower sum[3:0] bits of the $A^2$ result are generated by the BitVector optimization logic 720.

The BitVector optimization logic 720 is the sequential logic gates that are used to generate the optimized BitVectors BV0-BV3 that become bits sum[0] through sum[3] of the $A^2$ result, respectively. That is, the BitVector optimization logic 720 is the sequential logic gates used to form Sum[0]=BitVector$_0$={a$_0$};
Sum[1]=BitVector$_1$={ZERO};
Sum[2]=BitVector$_2$={∼a$_0$∩a$_1$}; and
Sum[3]=BitVector$_3$={a$_0$∩(a$_1$⊕a$_2$)}.

Referring now to FIG. 7C, exemplary BitVector optimization logic 720 is illustrated. The BitVector optimization logic 720 includes an inverter gate 722, an exclusive-OR (XOR) gate 724, a pair of AND gates 726-727, and a pair of connectors couple together as shown. The first connector couples bit a$_0$ of vector A to the sum[0] bit. The second connector is coupled to ground to couple logic zero into the sum[1] bit.

The inverter 722 inverts bit a$_0$ of vector A into its complement, ∼a$_0$. The output of inverter 722 is coupled to an input of the AND gate 727. The AND gate 727 logically ANDs bit a$_1$ of vector A and ∼a$_0$ together to generate the sum[2] bit.

Exclusive-OR (XOR) gate 724 exclusively ORs bits a$_1$ and a$_2$ of vector A together. The output of the XOR gate 724 is coupled to an input of the AND gate 726. The AND gate 727 logically ANDs bit a$_0$ of vector A together with the output from the XOR gate 724 to generate the sum[3] bit.

Figure 7B:
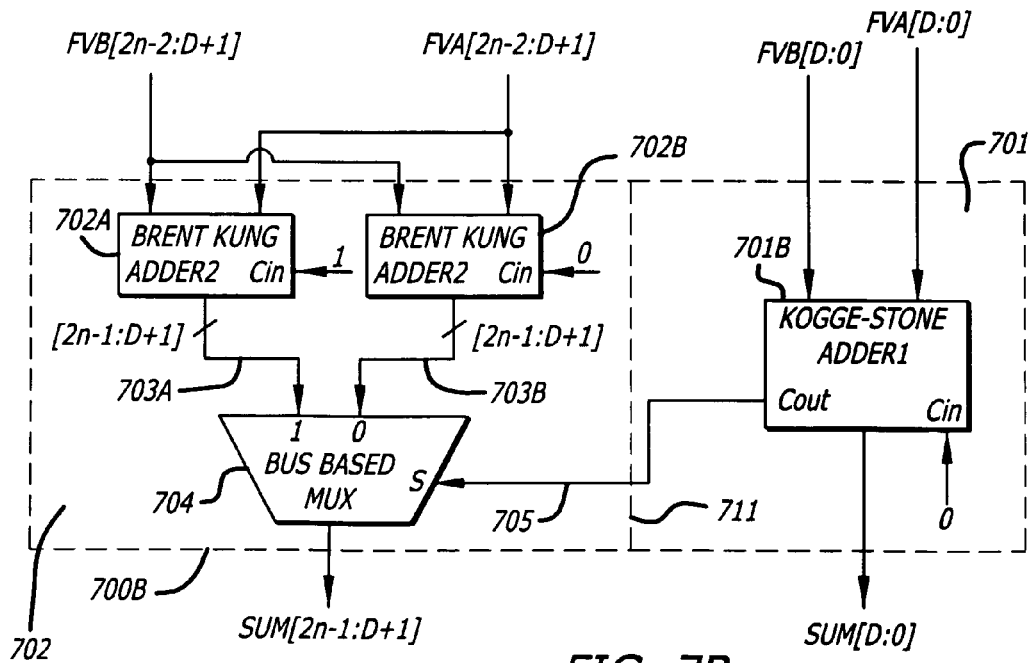
FIG. 7B is a functional block diagram illustrating a second embodiment of a hybrid multibit adder to generate a sum output result.

Referring now to FIG. 7B, a hybrid multibit adder 700B is illustrated. The hybrid multibit adder 700B can generate the resultant output ("$A^2$ Result") of the squarer functional block if the BitVectors BV3-BV0 are not optimized and generated by the BitVector optimization logic 720. Additionally, the hybrid multibit adder 700B may be used in other functional blocks as an adder.

The hybrid multibit adder 700B is also split into two smaller-sized sub-adders. The DividerBit D is the bit at which a partition is made between the two smaller-sized sub adders. The two smaller-sized sub-adders may be referred to as Adder1 701 and Adder2 702. The DividerBit D establishes a dividing line 711 between Adder1 701 and Adder2 702.

The hybrid multibit adder 700B is similar to the hybrid multibit adder 700A but has a different number of bits coupled into and out of the KS adder 701B when compared with the KS adder 701A illustrated in FIG. 7A. In this case, the KS adder 701B receives input data of FVB[D:0] bits and FVA[D:0] bits. The carry input bit of the KS adder 701B is similarly set to logic zero. Thus, the KS adder 701B generates the sum[D:0] bits. Otherwise, the details of the hybrid multibit adder 700B are similar to the hybrid multibit adder 700A using similar reference numbering and are incorporated here by reference.

While Adder2 702 is illustrated as having two BK adders 702A-702B and a multiplexer 704, a single BK adder may be used in the alternative without the multiplexer 704. The carry out bit 705 from the KS adder 701A,701B is then coupled into the carry input of the single BK adder.

DividerBit Computation

As discussed previously, the arrival times of the bits of vector A to a squarer functional block can differ between each input bit. At the hybrid multibit adder 700A, the bits of vector A are used to generate the final two vectors (FVA[2n−2:4] and FVB[2n−2:4]) from the BitVectors. The arrival times of individual bits of the final two vectors (FVA[2n−2:4] and FVB[2n−2:4]) will also vary from each other, in part due to the different arrival times of the bits in vector A.

The two final vectors (FVA[2n−2:4] and FVB[2n−2:4]) can be viewed as being two horizontal vectors or operands, each having (2n−5) elements or bits. Therefore, the final addition of BitVectors is a 2-operand addition. In the hybrid multibit adder 700A, the inputs are two operands having a width of (2n−5) bits and the output is one vector having a width of (2n−4) bits. To simplify references, we refer to the final vector output FVA[2n−2:4] as vector X ($x_{2n-2}$, $x_{2n-3}$, ..., $x_5$, $x_4$) and the final vector output FVB[2n−2:4] as vector Y ($y_{2n-2}$, $y_{2n-3}$, ... $y_5$, $y_4$).

To design the hybrid multibit adder 700A, input arrival time patterns to the final adder were analyzed over different types and bit widths of squarer circuits. Analysis showed that the two final vectors FVA and FVB may have somewhat different arrival times.

Reference is now made to FIG. 6 illustrating a graph of arrival times along a y-axis versus bit number along an x-axis of an exemplary analysis performed on an 11-bit squarer. The hybrid multibit adder 700A is (2n−5) bits wide which in this case is 17 bits wide (bit 4 to bit 20) with the four least significant bits (bit 0 to bit 3) being generated by the BitVector optimization logic 720. In contrast, the hybrid multibit adder 700B is (2n−1) bits wide which in this case is 21 bits wide (bit 0 to bit 20).

As discussed previously, the arrival time of the input bits of vector A can differ. With additional terms usually in the middle of the BitVectors, it might be expected that the middle bits at the hybrid multibit adder would arrive at a later time than LSB or MSB bits (FVA and FVB) of the BitVectors. For example, in FIG. 6, bit 14, y[13], appears to have the largest arrival or delay time for the bits of the Y of FVB vector. Bit 13, x[12], appears to have the largest arrival or delay time for the bits of the X of FVA vector. $X_L$ and $Y_L$ are the bit numbers of each vector X and Y, respectively, having the maximal delay or arrival time. As is illustrated in FIG. 6 for example, $X_L$=12 and $Y_L$=13. The profile of the different arrival times of the bits in each vector has somewhat of a bell shape associated with it. However the chart of FIG. 6 is exemplary and different logic or different arrival times of the input bits of vector A may provide a different profile leading to different bit numbers of $X_L$ and $Y_L$ of each vector X and Y respectively having the maximal delay or arrival time. In any case, the synthesis of the hybrid multibit adder for the squarer functional block is responsive to the profile of the different arrival times of the bits.

As discussed previously, the DividerBit D is the bit at which a partition is made between two smaller-sized sub adders in the hybrid multibit adder. The DividerBit D establishes a dividing line 711 between Adder1 701 and Adder2 702 as to which bits are to be received by each and the width of the adders. That is, the DividerBit D determines the overall topology or the structure of the hybrid multibit adder. Additionally, the performance quality of the hybrid multibit adder may be substantially influenced by the position of the DividerBit.

In one embodiment of the invention, the DividerBit of the hybrid multibit adder 700A-700B is determined by a timing-driven algorithm. That is, the DividerBit is determined partly in response to the arrival time profile of the different bits. The DividerBit is further determined in part in response to different types of timing constraints and different technology libraries that are part of the standard cell library.

An algorithm for the determination of the DividerBit for the hybrid multibit adder 700A is as follows:

------- Begin DividerBit Computation Algorithm ------
Del(Mux)=Delay of the fastest 2-to-1 MUX from the technology library
$x_L$=The bit of the vector X, which has largest arrival-time
$y_L$=The bit of the vector Y, which has largest arrival-time
min=Max($x_L$, $y_L$)
// Initialization
T(Best)=99999999
DividerBit=-1
for (current=min to (2n-2))
begin
   // Try to find if current could be the DividerBit
   Estimate Level-based delay of Adder1 with Kogge-Stone architecture (width=current-3)
   Estimate Level-based delay of Adder2 with Brent Kung architecture (width=2n-current-2); assuming that the Carry$_{in}$ is available at time 0
   T(Add1)=Estimated time when Carry$_{out}$ of Adder1 would be available
   T(Add2)=Estimated time when all the Sum bits and Carry$_{out}$ of Adder2 would be Available; assuming that the Carry$_{in}$ is available at time 0
   // Compute the total delay of the whole adder
   if (T(Add1)>T(Add2)}
     T(Total-adder)=T(Add1)+Del(Mux)
   else
     T(Total-adder)=T(Add2)+Del(Mux)
   endif
   if (T(Total-adder)<T(Best))
     T(Best)=T(Total-adder)
     DividerBit=current
   endif
end // for
return DividerBit; // returns -1 if optimal DividerBit is not found
------- End DividerBit Computation Algorithm ------

Figure 9:
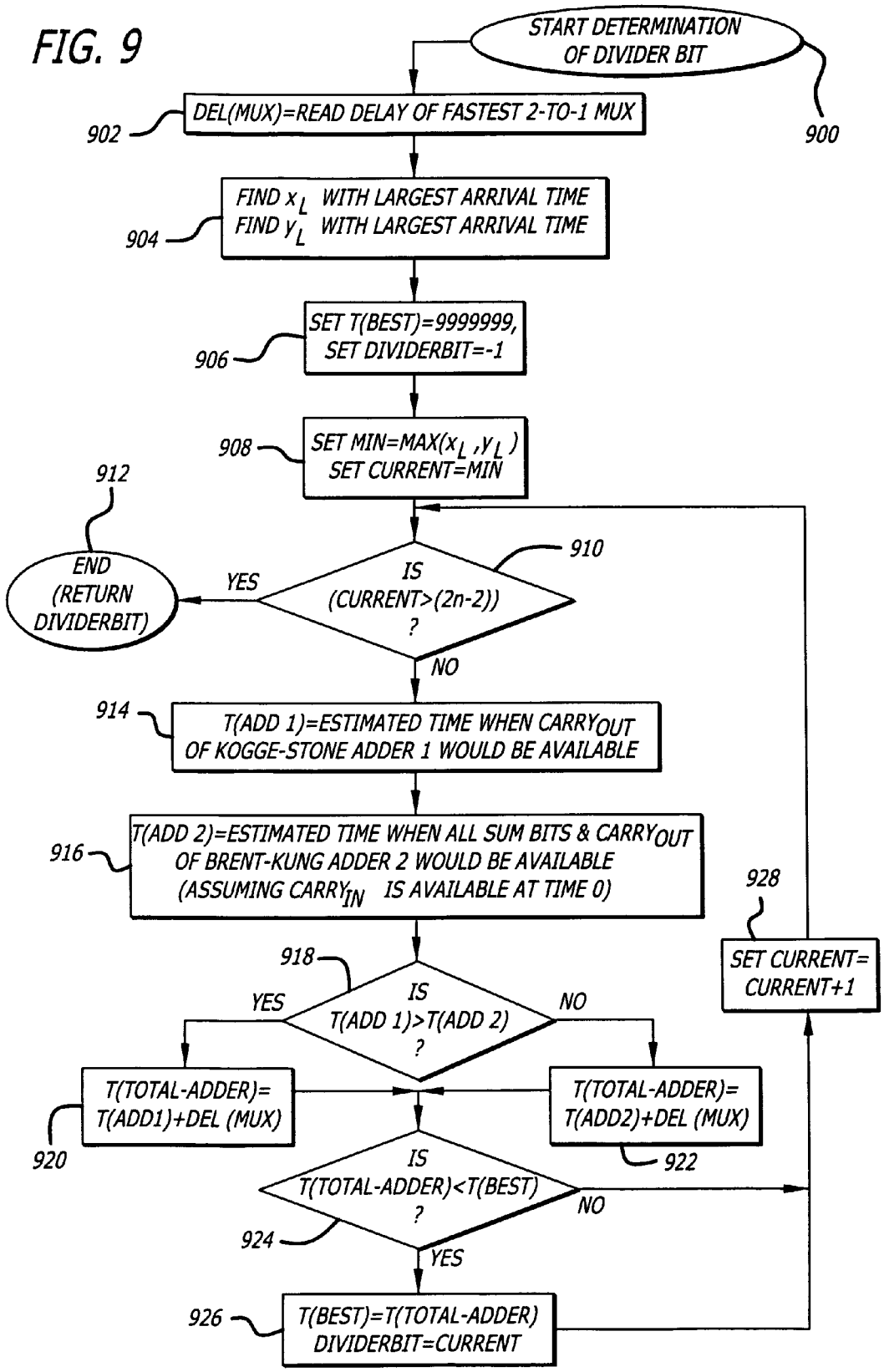
FIG. 9 is a flow chart of a method to compute a DividerBit to determine how to divide the number of bits to be added between adders in the hybrid multibit adder of FIG. 7A.

FIG. 9 illustrates the DividerBit Computation Algorithm in flowchart form. The computation of the DividerBit begins at block 900 and then goes to block 902. Recall that the DIVIDERBIT D forms a dividing line 711 between the first adder 701 and the second adder 702 and adjusts the bit width of each.

At block 902, the delay of the fastest two-to-one multiplexer is read from the technology library file of the standard cell library. The two-to-one multiplexer may be instantiated for each bit of the buses 703A-703B to form the bus based multiplexer 704. The variable Del(Mux) is set equal to the delay of the fastest 2-to-1 MUX read out from the technology library and then the method goes to block 904.

At block 904, the bits of final vector A (FVA) and final vector B (FVB) with the largest or peak arrival time ($x_L$ and $y_L$, respectively) are determined from a profile such as that shown in the chart of FIG. 6 for example. That is $x_L$, the bit number of the vector X (FVA) which has largest arrival-time, is determined. The value $y_L$, the bit number of the vector Y (FVB) which has largest arrival-time, is determined. From FIG. 6, the values for $x_L$ and $y_L$ with maximum or peak arrival times are respectively 12 and 13, for example. The values for $x_L$ and $y_L$ are utilized in determining where to place the DividerBit D in the hybrid multibit adder 700A. After determining values for $x_L$ and $y_L$, the process goes to block 906.

At block 906, the variables T(BEST) and DIVIDERBIT D are initialized. The variable T(BEST) is set to a large number such as 9999999 for example. The DIVIDERBIT D variable is set to the value negative one (-1).

Then at block 908, the variables min and current are initialized. The variable min is set equal to the maximum of $x_L$ and $y_L$, the bits with the largest arrival time. The variable current is set equal to the value of the min variable at this time. After initialization, the method goes to block 910.

At block 910, a determination is made if the current variable is greater than the quantity of (2n-2). The (2n-2) represents the largest bit number and most significant BitVector that is coupled into the hybrid multibit adder. Thus, if the current variable is greater than the largest bit number coupled into the adder, then it exceeds any possible dividing position in the hybrid multibit adder and the DividerBit D is unused. If the current variable is greater than the largest bit number, then the method goes to block 912. If the current variable is not greater than the largest bit number, then the method goes to block 914.

At block 912, the computation of the DividerBit ends and the value of the DividerBit is returned, if any, for further use below in generating the hybrid multibit adder.

At block 914, a first adder delay T(ADD1) estimation is made as to when the carry out bit 705 from the KS adder 701A is available. Recall that the carry out bit 705 from the KS adder 701A is to select the either the first BK adder 702B or the second BK adder 702A to be output from the bus-based multiplexer 704. The first adder delay T(ADD1) estimation is responsive to the adder width set by the value of the current variable which finally generates the DIVIDERBIT D. That is, the width of the KS adder 701A is set to be equal to the quantity (current-3) and then the first adder delay T(ADD1) estimation is made. After determining the first adder delay T(ADD1) estimation, the process goes to block 916.

At block 916, a second adder delay T(ADD2) estimation is made for a BK adder assuming that the carry input bit (logic zero or one) is available at time 0. The second adder delay T(ADD2) estimation is made to determine when all the sum bits and the carry out bit from the BK adders 702A-702B would be available on buses 703A-703B to the input of the bus-based multiplexer 704. That is, the second adder delay T(ADD2) estimation is the estimated timing delay in the slowest output bit in the BK adder, with the carry input bit set to logic zero or one at time zero. Stated differently, the second adder delay T(ADD2) estimation is the worst case timing delay in the sum out bits and the carry out bit of the second adder. The second adder delay T(ADD2) estimation is a function of the bit width of the BK adders 702A-702B that is set by the value of the current variable which finally generates the DIVIDERBIT D. That is, the width of the BK adders 702A-702B is set to be equal to the quantity (2n-2-current) and then the second adder delay T(ADD2) estimation is made. After determining the second adder delay T(ADD2) estimation, the process goes to block 918.

With both of the first adder delay T(ADD1) estimation and the second adder delay T(ADD2) estimation, the current position of the DividerBit may be adjusted so that the overall delay of the hybrid multibit adder is minimized.

At block 918, a determination is made whether the first adder delay T(ADD1) estimation is greater than the second adder delay T(ADD2) estimation. If the first adder delay T(ADD1) estimation is greater than the second adder delay T(ADD2) estimation, then the method moves to block 920. However, if the first adder delay T(ADD1) estimation is less than or equal to the second adder delay T(ADD2) estimation, then the method proceeds to block 922.

At block 920, a total adder delay T(TOTAL-ADDER) estimation is generated by summing together the first adder delay T(ADD1) estimation and the delay of the multiplexer DEL (MUX). The process then moves to block 924.

Alternatively at block 922, the total adder delay T(TOTAL-ADDER) estimation is generated by summing together the second adder delay T(ADD2) estimation and the delay of the multiplexer DEL(MUX). The process then moves to block 924.

At block 924, a determination is made if the total adder delay T(TOTAL-ADDER) estimation is less than the best time value T(BEST). If the total adder delay T(TOTAL-ADDER) estimation is less than the best time value T(BEST), the method goes to block 926. If the total adder delay T(TOTAL-ADDER) estimation is greater than or equal to the best time value T(BEST), the method goes to block 928 skipping block 926. In this case, the "current" variable setting for dividing the widths of the first adder 701 and the second adder 702 has resulted in an increased delay over that of the best delay and is not to be set as the DIVIDERBIT D.

At block 926, the best delay time value T(BEST) is updated by setting it equal to the total adder delay T(TOTAL-ADDER) estimation. Additionally, the DIVIDERBIT D is set to be equal to the value of the current variable. After updating and setting these values, the process goes to block 928.

The goal of blocks 918, 920, 922, 924, and 926 is to balance the timing delays of generating the carry output 703 of the first KS adder 701A with generating the carryout and sum bits of either the first or second BK adder 702A-702B, within a delay of one multiplexer 704. That is, the DIVIDER BIT D is generated in response to estimated timing delays of the carry output 703 of the first KS adder 701A, the carryout and sum bits of either the first or second BK adder 702A-702B, and output selection (e.g., select to output delay or input-to-output delay) of the multiplexer 704. Note that the timing delays of the carry output 703 of the first KS adder 701A and the carryout and sum bits of the first and second BK adders 702A-702B are influenced by the arrival times of the input bits.

At block 928, the current value is incremented by setting it equal to current plus one. From block 928, the method goes back to block 910 to complete a loop. At block 910 once again the determination is made if the current variable is greater than the number of inputs to the adder 2n–2. The method continues to loop through blocks 910, 914, 916, 918, 920 or 922, 924, 926, and 928 until the current value is greater than 2n–2, exceeding the maximum bit number of the inputs to the adder.

As the method loops through these blocks, the total adder delay T(TOTAL-ADDER) estimation and the best delay time value T(BEST) become more refined based on the setting of the DIVIDERBIT D adjusting the bit widths of the adders. At one point, an optimum DIVIDERBIT D is found and the process may loop through blocks 910, 914, 916, 918, 920 or 922, 924, and 928 skipping 926 so that DIVIDERBIT D is no longer updated.

Hybrid Multibit Adder Generation

After identifying the DividerBit (block 506), the hybrid multibit adder can be generated (block 508). In one embodiment of the invention, the hybrid multibit adder may be formed of two Brent-Kung adders (in Carry-select style), one Kogge-Stone adder, and one binary 2-to-1 bus based multiplexer (bus mux).

FIG. 7A illustrates a functional block diagram of the hybrid multibit adder 700A with a DividerBit=D. The DividerBit effectively forms a dividing line 711 in the hybrid multibit adder between the lower significant bits that are added together using the Kogge-Stone adder and the upper significant bits that are added together using the Brent-Kung adders.

The algorithm for the design of the hybrid multibit adder (given the DividerBit=D) is as follows:

------- Begin Hybrid Multibit Adder Generation Algorithm ------ if (DividerBit≠–1) then
  Implement the Adder1 with Kogge-Stone architecture (width=D–3)
  Implement the first Adder2 (copy 0) with Brent-Kung architecture (width=2n–2–D) with $Carry_{in}$ set to 0
  Implement the second Adder2 (copy 1) with Brent-Kung architecture (width=2n–2–D) with $Carry_{in}$ set to 1
  Implement a 2-to-1 bus-based binary MUX (width=2n–1–D).
    Two data inputs are outputs of the first and second Adder2
    The select control input is the $Carry_{out}$ of Adder1
    Concatenate (2n–1–D) bit output of MUX with (D–3) bit wide output of Adder1. That creates the (2n–4) bit wide final sum output.
    return the (2n–4) bit wide final output signal
else
  // There is no suitable DividerBit for hybrid multibit adder generation
  No need to design hybrid multibit adder. Design a single fast multibit adder.
end ------- End Hybrid Multibit Adder Generation Algorithm ------

Figure 10:
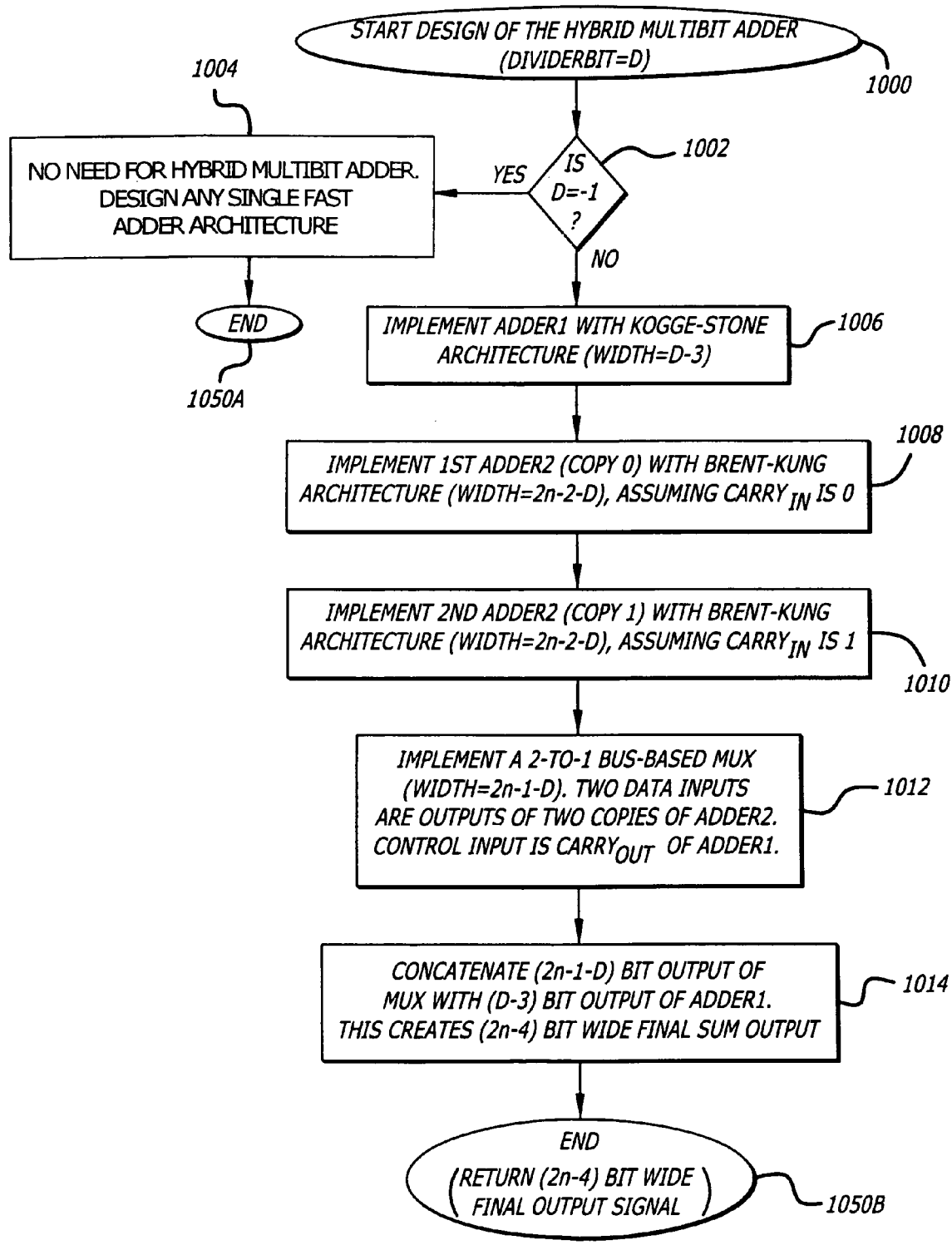
FIG. 10 is a flow chart of a logic synthesis method of a hybrid multibit adder for functional blocks including a squarer arithmetic operation.

FIG. 10 illustrates the Hybrid Multibit Adder Generation Algorithm in flowchart form to synthesize the hybrid multibit adder 700A. The synthesis of the hybrid multibit adder begins at block 1000 given the DividerBit value D and then goes to block 1002. The DividerBit value d was previously computed by the DividerBit Computation Algorithm illustrated by the flowchart of FIG. 9.

At block 1002, a determination is made if the DividerBit D is set to negative one. Previously, the DividerBit D was set to negative one during initialization at block 906 of FIG. 9. If it is still negative one at block 1002, it indicates that a valid DividerBit could not be found. Thus, if the DividerBit D is set to negative one then the process goes to block 1004. However, if the DividerBit D is set to a value other than negative one, the method goes to block 1006.

At block 1004, with the DividerBit D is set to negative one there is no need for the use of a hybrid multibit adder and any single fast adder architecture may be used to implement the adder 410 in FIG. 4. The method then goes to 1050A and ends without generating a hybrid multibit adder.

At block 1006, the KS adder 701A is implemented as the first adder 701 of the hybrid multibit adder 700A. The KS adder 701A is implemented using a Kogge-Stone architecture and having a width equal to the quantity (D–3). The quantity of three subtracted from the DividerBit D (D–3) is used for the bit width of the adder because BitVectors BV0 through BV3 have been optimized and already generate the sum bits sum[3:0]. If the KS adder 701B is to be synthesized instead, the KS adder 701B is implemented using the Kogge-Stone architecture but having a width equal to the quantity (D). With the KS adder 701A or KS adder 701B synthesized, the process goes to block 1008.

At block 1008, the first BK adder 702B of the second adder 702 is generated using a Brent Kung architecture. The first BK adder 702B is implemented using a Brent Kung architecture and having a width equal to the quantity of (2n−2−D). The value of the DividerBit D is subtracted from the maximum BitVector number (2n−2) in order to determine the width of the first BK adder 702B. That is, the width of the first BK adder 702B is responsive to the value of the DividerBit D. The first BK adder 702B is further implemented with its carry in being set to logic zero. This is so that the carry input is available at time equal to zero and causes little delay in the first BK adder 702B. After synthesizing the first BK adder 702B, the process goes to block 1010.

At block 1010, the second BK adder 702A of the second adder 702 is generated using a Brent Kung architecture with a width of (2n−2−D). The value of the DividerBit D is subtracted from the maximum BitVector number (2n−2) in order to determine the width of the second BK adder 702A. That is, the width of the second BK adder 702A is also responsive to the value of the DividerBit D. The second BK adder 702A is further implemented with its carry in being set to logic one. This is so that the carry input is available at time equal to zero and causes little delay in the sum output of the second BK adder 702A. After synthesizing the second BK adder 702A, the process goes to block 1012.

At block 1012, the two-to-one bus based multiplexer 704 is synthesized having a bit width of (2n−1−D). The select input S of the bus base multiplexer is coupled to the carry output 705 of the KS adder 701A implemented by block 1006. The data inputs for the bus base multiplexer 704 are the buses 703A-703B that include the sum output bits of the BK adders 702A-702B as well as the carry output of each. In this manner, the sum output bits should be available to the inputs of the bus base multiplexer such that the carry out bit from the Kogge-Stone adder need only select which to feed through onto the final sum bit output, sum[2n−1:D+1]. After implementing the multiplexer, the process goes to block 1014.

At block 1014, the sum output bits sum[2n−1:D+1] of the bus base multiplexer 704 are concatenated with the sum output bits SUM[D:4] of the Kogge-Stone adder 701A, and the sum output bits SUM[3:0] from the BitVector optimization logic 720 to form the 2n−1 bits of the final sum output for the $A^2$ result. With the final sum output being formed, the process goes to block 1050B.

At block 1050B, the synthesis of the hybrid multibit adder is completed and ends with the results of the sum output bits 2n−4 of the hybrid multibit adder is returned.

Extensions to Squaring Algorithm

The foregoing methods for synthesis of a Squaring (a*a) function may be used in whole or in part to synthesize modules for a few other expressions as follows $$a*a+1 \qquad\qquad 1)$$

Vector A squared plus one can be readily implemented during the generation of BitVectors. In the BitVectors Generational Algorithm, we substitute in the following two new equations:

BitVector $BV0=\{\sim a_0\}$

BitVector $BV1=\{a_0\}$

The methods of reduction of BitVectors, DividerBit computation, and Hybrid Multibit Adder are the same. One extra inverter is generated in comparison with the formation of the squarer alone. The delay of Vector A squared plus one should be substantially the same as Vector A squared. The area used by Vector A squared plus will a little more than the area of the Vector A squarer due to the extra inverter.

$$a*a+2 \qquad\qquad 2)$$

Vector A squared plus two can be readily implemented during the generation of BitVectors with a trivial extension. In the BitVectors Generational Algorithm, we substitute in the following new equation:

BitVector $BV1=\{1\}$

The methods of reduction of BitVectors, DividerBit computation, and Hybrid Multibit Adder are the same. The area and delay of Vector A squared plus two should be substantially the same as Vector A squared.

Electronic Design Automation Tool

Figure 11:
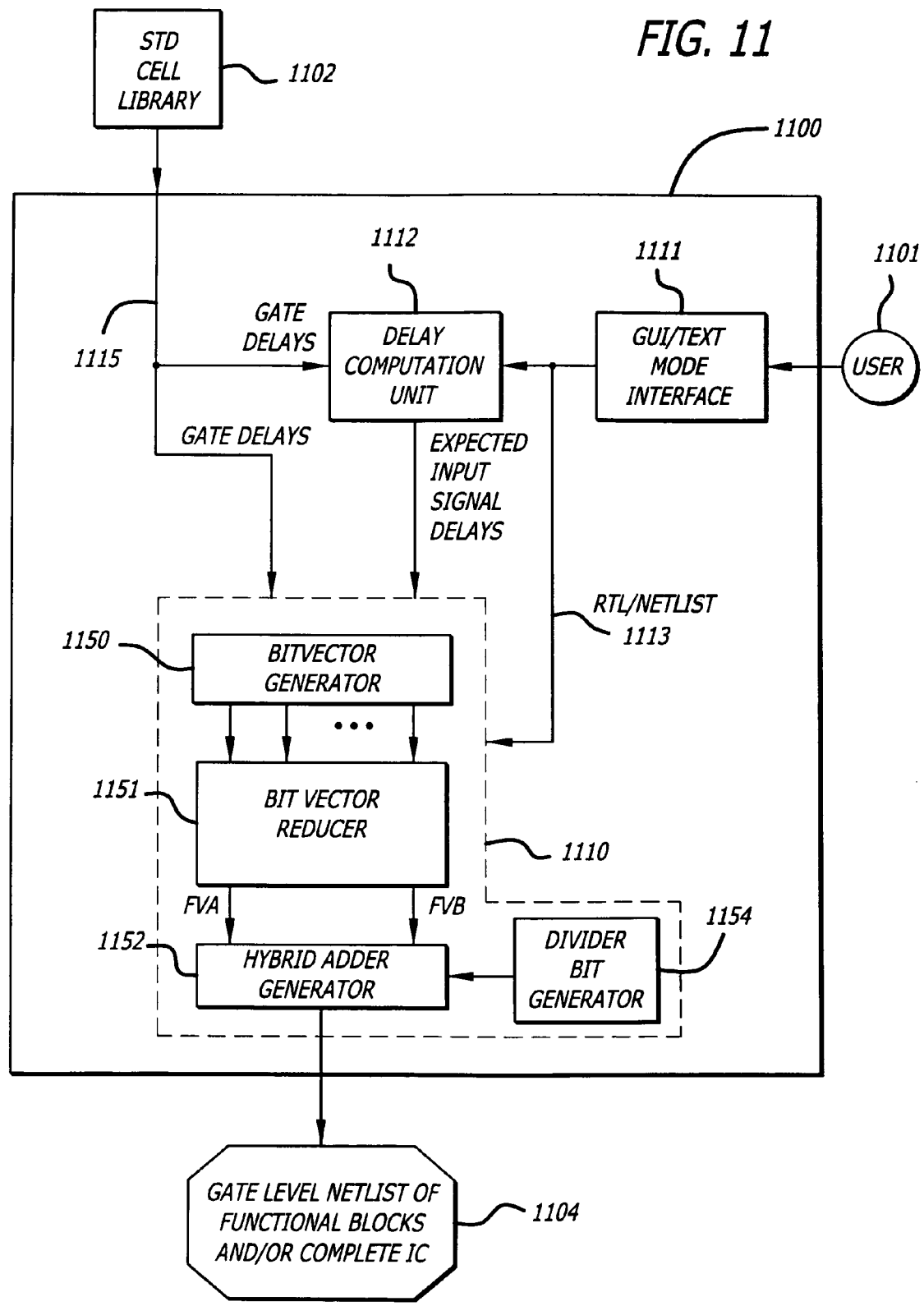
FIG. 11 is a block diagram of software modules of embodiments of the invention used to perform logic synthesis of functional blocks including a squarer arithmetic operation.

Referring now to FIG. 11, an exemplary block diagram is illustrated of software modules of an electronic design automation (EDA) tool 1100 used to perform logic synthesis of functional blocks that include a squaring mathematical operation. The synthesis EDA tool 1100 receives user inputs from a user 1101 and a standard cell technology library 1102 in order to generate a gate level net list 1104 of functional blocks and/or the complete integrated circuit. The EDA tool 1100 includes a graphical user interface (GUI) or a text mode interface 1111 for receiving inputs from the user 1101 in the form of a register transfer level (RTL) description (for example, Verilog, VHDL, System-Verilog, System-C, etc.) or netlist of the sum of products functional block, as well as other functional blocks of the integrated circuit.

The input (RTL/Netlist) 1113 description of the functional blocks/integrated circuit is coupled into a squarer synthesizer 1110 and a delay computation unit 1112. The delay computation unit 1112 computes the expected input signal delays as well as the delays for all the product terms that are to be generated for the squarer functional block. The delay computation unit 1112 further receives the gate delay information 1115 from the technology library of the standard cell library 1102 to compute the expected delays and/or arrival times of signals. The expected gate delay information for the fastest two-to-one multiplexer or another equivalent type of gate is provided to the squarer synthesizer 1110 in order to compute the DividerBit position to generate the hybrid multibit adder. An exclusive OR gate delay may also be provided to make a determination as to whether a half adder or a full adder should be used to respectively reduce two or three terms in a BitVector by the BitVector reducer 1151.

The squarer synthesizer 1110 includes algorithms to generate the optimization logic and the BitVectors for the BitVector generator 1150, the logic for the BitVector reducer 1151, compute the DividerBit in the DividerBit generator 1154, and the logic for the hybrid multibit adder generator 1152 to add the two final vectors FVA, FVB together in order to form mathematical operation of the squarer functional block. The logic to generate a KS adder and a BK adder is known. The DividerBit generator 1154 determines how to divide the input bits to the adder between the KS adder and the BK adder, effectively setting the width of each. Exemplary algorithms for use in generating the logic of the BitVectors was previously described.

Computing System

Figure 12:
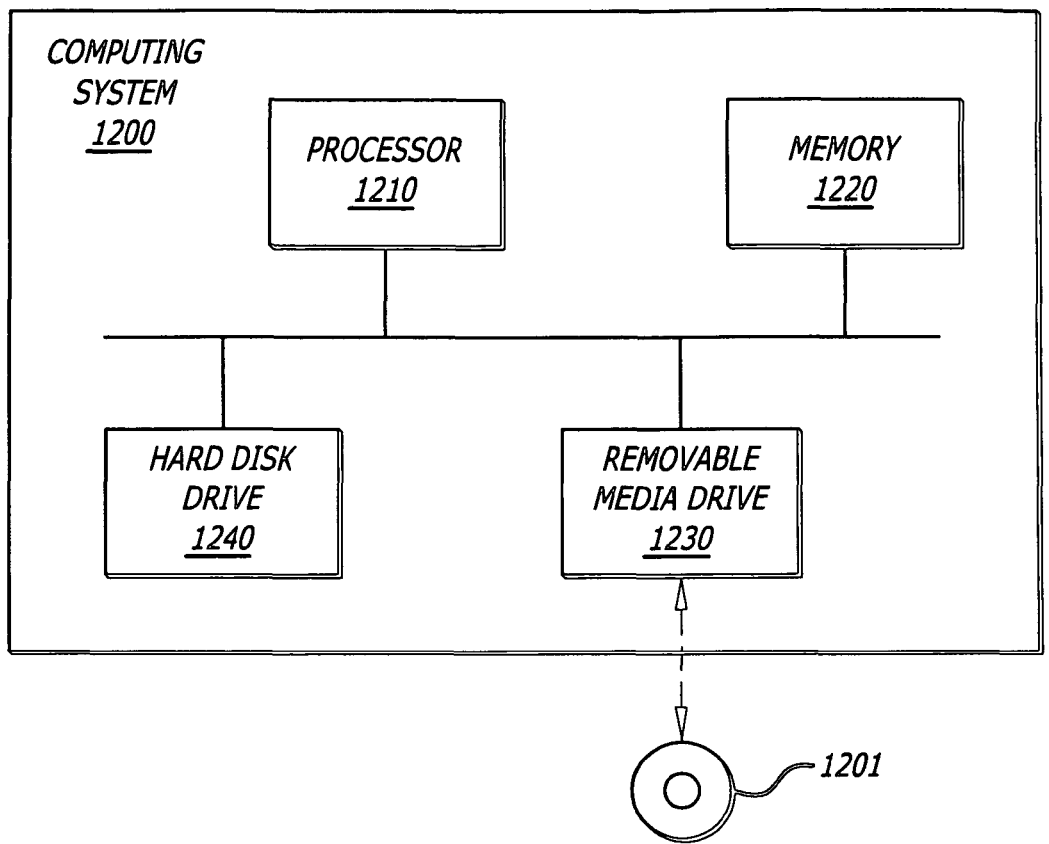
FIG. 12 illustrates an exemplary embodiment of a computing system usable with embodiments of the invention.

Referring now to FIG. 12, a computing system 1200 is illustrated that may be used to perform some or all of the processes in accordance with a number of embodiments of the invention. In one embodiment of the invention, the computing system 1200 includes a processor 1210, a memory 1220, a removable media drive 1230, and a hard disk drive 1240. In one embodiment, the processor 1210 executes instructions residing on a machine-readable medium, such as the hard disk drive 1240, a removable medium 1201 (e.g., an optical medium (compact disk (CD), digital video disk (DVD), etc.), a magnetic medium (magnetic disk, a magnetic tape, etc.), or a combination of both. The instructions may be loaded from the machine-readable medium into the memory 1220, which may include Random Access Memory (RAM), dynamic RAM (DRAM), etc. The processor 1210 may retrieve the instructions from the memory 1220 and execute the instructions to perform the operations described above.

Note that any or all of the components and the associated hardware illustrated in FIG. 12 may be used in various embodiments of the system 1200. However, it should be appreciated that other configurations of the system 1200 may include more or less devices than those shown in FIG. 12.

Some portions of the preceding detailed description have been presented in terms of algorithms and symbolic representations of operations on data bits within a computer memory. These algorithmic descriptions and representations are the tools used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be kept in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The embodiments of the invention also relates to an apparatus for performing the operations described herein. This apparatus may be specially constructed for the required purposes, or it may comprise a general-purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The processes and displays presented herein are not inherently related to any particular computer or other apparatus. Various general-purpose systems may be used with programs in accordance with the teachings herein, or it may prove convenient to construct a more specialized apparatus to perform the operations described. The required structure for a variety of these systems will appear from the description below. In addition, the embodiments of the invention are not described with reference to any particular programming language. It will be appreciated that a variety of programming languages may be used to implement the teachings of the invention as described herein.

A machine-readable medium includes any mechanism for storing or transmitting information in a form readable by a machine (e.g., a computer). For example, a machine-readable medium includes read only memory ("ROM"); random access memory ("RAM"); magnetic disk storage media; optical storage media; flash memory devices; electrical, optical, acoustical or other form of propagated signals (e.g., carrier waves, infrared signals, digital signals, etc.); etc.

The embodiments of the invention are thus described. While embodiments of the invention have been particularly described, they should not be construed as limited by such embodiments, but rather construed according to the claims that follow below.

While certain exemplary embodiments have been described and shown in the accompanying drawings, it is to be understood that such embodiments are merely illustrative of and not restrictive on the broad invention, and that the embodiments of the invention not be limited to the specific constructions and arrangements shown and described, since various other modifications may occur to those ordinarily skilled in the art.

When implemented in software, the elements of the embodiments of the invention are essentially the code segments to perform the necessary tasks. The program or code segments can be stored in a processor readable medium or transmitted by a computer data signal embodied in a carrier wave over a transmission medium or communication link. The "processor readable medium" may include any medium that can store or transfer information. Examples of the processor readable medium include an electronic circuit, a semiconductor memory device, a read only memory (ROM), a flash memory, an erasable programmable read only memory (EPROM), a floppy diskette, a CD-ROM, an optical disk, a hard disk, a fiber optic medium, a radio frequency (RF) link, etc. The computer data signal may include any signal that can propagate over a transmission medium such as electronic network channels, optical fibers, air, electromagnetic, RF links, etc. The code segments may be downloaded via computer networks such as the Internet, Intranet, etc.

What is claimed is:

1. An integrated circuit (IC) design tool for synthesizing logic for a squarer functional block with user selectable bit width instantiated by a register transfer level netlist, the IC design tool comprising:
   code of one or more software modules stored in a storage device and executable by a processor to synthesize a gate-level netlist of a squarer functional block with a user selected bit width N, wherein the user selected bit width N is a variable, the one or more software modules including
   a bitvector generator to multiply N bits of an input vector together to generate partial products of a squarer functional block for a plurality of bitvectors and to optimize a plurality of least significant bitvectors to synthesize bitvector optimization logic,
   a bitvector reducer coupled to the bitvector generator, the bitvector reducer to reduce the partial products in bitvectors of the squarer functional block down to a pair of final vectors and synthesize bit logic of the pair of final vectors, a dividerbit generator to generate a value of a dividerbit for a hybrid multibit adder in response to expected arrival times of bits of the pair of final vectors to be coupled into a first adder and a second adder of the hybrid multibit adder, the value of the dividerbit to balance estimated timing delays between the first adder and the second adder and couple one or more slower bits of the pair of final vectors into the first adder, and a hybrid multibit adder generator coupled to the dividerbit generator to receive the value of the dividerbit, the hybrid multibit adder generator to synthesize logic of the hybrid multibit adder including the first adder and the second adder coupled together by a carry out bit, the second adder being a different type of adder than the first adder, wherein each of a first bit width of the first adder and a second bit width of the second adder are responsive to the user selected bit width N and the dividerbit, the hybrid multibit adder coupled to the bit logic of the pair of final vectors to add the pair of final vectors together to generate a final result for the squarer functional block.

2. The integrated circuit (IC) design tool of claim 1, wherein
the bitvector generator to generate bitvector optimization logic to at least optimize each of four least significant bitvectors down to a single output term as four least significant bits of the final result for the squarer functional block without addition by the hybrid multibit adder.

3. The integrated circuit (IC) design tool of claim 1, wherein
the dividerbit separates slower lesser significant bits of the pair of final vectors into the first adder from faster more significant bits of the pair of final vectors into the second adder.

4. The integrated circuit (IC) design tool of claim 1, wherein
the dividerbit generator generates the value for the dividerbit further in response to estimated timing delays in the carry out bit from the first adder and the slowest output bit in the second adder.

5. The integrated circuit (IC) design tool of claim 4, wherein
the dividerbit substantially balances the estimated timing delay of the carry out bit from the first adder and the estimated timing delay of the slowest output bit in the second adder.

6. The integrated circuit (IC) design tool of claim 5, wherein
the dividerbit generator generates the value for the dividerbit further in response to an estimated select to output timing delay of a multiplexer.

7. The integrated circuit (IC) design tool of claim 6, wherein
the dividerbit substantially balances the estimated timing delays within a resolution of the estimated select to output timing delay of the multiplexer.

8. The integrated circuit (IC) design tool of claim 4, the code of one or more software modules stored in the storage device and executable by the processor further includes a delay computation unit software module to receive gate delays of a cell library and compute the expected arrival times of the pair of final vectors to the hybrid multibit adder.

9. The integrated circuit (IC) design tool of claim 8, wherein
the delay computation unit software module further to compute
the estimated timing delay in the carry out bit from the first adder and
the estimated timing delay in the slowest output bit in the second adder.

10. The integrated circuit (IC) design tool of claim 8, the code of one or more software modules stored in storage device and executable by the processor further includes
a user interface software module to generate the RTL netlist including at least one squarer functional block.

11. The integrated circuit (IC) design tool of claim 1, wherein
the bitvector reducer is responsive to timing delays of N bits of the input vector to select between using a half adder or a full adder to reduce the partial products in bitvectors of the squarer functional block down to a pair of final vectors.

12. A machine-readable product to synthesize logic for a squarer functional block with a variable user selectable bit width, the machine-readable product comprising:
a non-transitory machine readable storage device having stored therein
machine readable program code to generate partial product terms of a squarer functional block in an integrated circuit (IC) design, to form elements of bitvectors, and to optimize the bitvectors to synthesize bitvector optimization logic of a plurality of least significant bit vectors;
machine readable program code to reduce the elements of each bitvector to at most two signals of a pair of final vectors and synthesize bit logic of the pair of final vectors;
machine readable program code to generate a value of a dividerbit in response to expected arrival times of bits of the pair of final vectors to be coupled into a first sub-adder and a second sub-adder of a hybrid multibit adder, the value of the dividerbit to balance timing delays between the first sub-adder and the second sub-adder; and
machine readable program code to synthesize logic of a hybrid multibit adder in communication with the machine readable program code to generate the value of the dividerbit to receive the value of the dividerbit, the machine readable program code to synthesize logic of the hybrid multibit adder including the first sub-adder and the second sub-adder coupled together by a carry bit, the second sub-adder being a different type of adder than the first sub-adder, each of the bit widths of the first sub-adder and the second sub-adder being responsive to the variable user selectable bit width and the value of the dividerbit, wherein the value of the dividerbit is a variable to couple one or more slower bits of the pair of final vectors into the first sub-adder, the hybrid multibit adder coupled to the bit logic of the pair of final vectors to add the pair of final vectors together to generate a final result of the squarer functional block.

13. The machine-readable product of claim 12, wherein
the machine readable storage device further has stored therein machine readable program code to generate a value for the dividerbit in response to an estimated timing delay in the carry bit generated by the first sub-adder and an estimated timing delay of the slowest output bit generated by the second sub-adder.

14. The machine-readable product of claim 13, wherein the first sub-adder comprises a Kogge-Stone adder, the second sub-adder includes a first Brent-Kung adder, a second Brent-Kung adder, and a bus-based multiplexer coupled to the first and second Brent-Kung adders, and the machine readable storage device further has stored therein
machine readable program code to generate the value for the dividerbit further in response to an estimated timing delay of the bus-based multiplexer.

15. A method of designing an integrated circuit including a squarer functional block, the method comprising:
with a processor,
generating bitvectors for a squarer functional block in response to a number of bits of an input vector selected by a user;
optimizing each of four least significant bitvectors to directly form four respective least significant sum output bits of the squarer functional block;
reducing bitvectors having more than two elements down to a pair of elements to generate bits of a pair of final vectors;
estimating a timing delay of a carry out bit in a first sub-adder;
estimating a worst case timing delay from either sum out bits or a carry out bit in a second sub-adder, the second sub-adder differing in type from the first sub-adder;
determining a dividing line in a hybrid multibit adder between the first sub-adder and the second sub-adder in response to the timing delay of the carry out bit from the first sub-adder and the worst case timing delay of either the sum out bits or the carry out bit from the second sub-adder, wherein the dividing line balances timing delays between the first sub-adder and the second sub-adder and couples one or more slower bits of the pair of final vectors into the first sub-adder; and
after determining the dividing line, forming the hybrid multibit adder, including each of the first sub-adder and the second sub-adder in response to the number of bits of the input vector selected by the user and the dividing line.

16. The method of claim 15, wherein the dividing line sets a first bit width for the first sub-adder and a second bit width for the second sub-adder to form the hybrid multibit adder.

17. The method of claim 16, wherein the dividing line is determined by computing a dividerbit in response to the timing delay of the carry out bit from the first sub-adder and the worst case timing delay of either the sum out bits or the carry out bit from the second sub-adder.

18. The method of claim 15, wherein the first sub-adder is a Kogge-Stone adder having a carry out bit and a carry in bit, the carry in bit of the Kogge-Stone adder being set to logic zero, and the second sub-adder includes
a first Brent-Kung adder having a carry in bit set to logic zero,
a second Brent-Kung adder having a carry in bit set to logic one, and
a bus-based multiplexer having data inputs coupled to the sum out bits and the carry out bits of the first and second Brent-Kung adders, and a select control input coupled to the carry out bit of the Kogge-Stone adder, the bus-based multiplexer to generate the output result of the squarer functional block.

19. The method of claim 15, wherein the reducing of bitvectors is responsive to timing delays of bits of the input signal to select between using a half adder or a full adder to reduce elements of the bitvectors down to a pair of elements.

20. An integrated circuit comprising:
a squarer with a hybrid multibit adder synthesized for bit widths of a first vector and a second vector, the hybrid multibit adder including
a Kogge-Stone adder having a carry bit input set to logic zero, the Kogge-Stone adder to respectively add a first plurality of bits of the first vector, including at least lesser significant bits four through six of the first vector, to a first plurality of bits of the second vector, including at least lesser significant bits four through six of the second vector, to generate a first carry out bit and lesser significant sum output bits of the hybrid multibit adder; and
a second adder differing from the Kogge-Stone adder having a carry bit input coupled to the first carry out bit of the Kogge-Stone adder, the second adder to respectively add a second plurality of bits of the first vector, having greater significance than the first plurality of bits, to a second plurality of bits of the second vector, having greater significance than the first plurality of bits, to generate second sum output bits and a second carry out bit in response to the first carry out bit.

21. The integrated circuit of claim 20, wherein the second adder includes
a first Brent-Kung adder having a carry input set to logic zero, the first Brent-Kung adder to respectively add the second plurality of bits of the first vector to the second plurality of bits of the second vector to generate the second sum output bits and the second carry out bit in response to the carry input being set to logic zero;
a second Brent-Kung adder having a carry input set to logic one, the second Brent-Kung adder to respectively add the second plurality of bits of the first vector to the second plurality of bits of the second vector to generate the second sum output bits and the second carry out bit in response to the carry input being set to logic one; and
a bus-based multiplexer having data inputs respectively coupled to the second sum output bits and the second carry out bits of the first and second Brent-Kung adders, and a select control input coupled to the first carry out bit, the bus-based multiplexer to generate more significant sum output bits of the hybrid multibit adder from the second sum output bits of the first Brent-Kung adder or the second sum output bits of the second Brent-Kung adder in response to the first carry out bit.

22. The integrated circuit of claim 21, wherein the bus-based multiplexer to generate the more significant sum output bits of the hybrid multibit adder from the second sum output bits of the first Brent-Kung adder in response to the first carry out bit being a logic zero.

23. The integrated circuit of claim 21, wherein
the bus-based multiplexer to generate the more significant sum output bits of the hybrid multibit adder from the second sum output bits of the second Brent-Kung adder in response to the first carry out bit being a logic one.

24. The integrated circuit of claim 21, wherein
the hybrid multibit adder is included as part of a squarer functional block with the first vector and the second vector being generated in response to an input vector, and
the squarer functional block further includes
bitvector optimization logic to receive three least significant bits zero through two of the input vector to at least generate the four least significant bits of a squared result.

25. The integrated circuit of claim 24, wherein
the bitvector optimization logic receives three least significant bits, bit zero through bit two, of the input vector and further has
bit zero of the input vector coupled to the first least significant bit of the squared result,
a logic zero coupled to the second least significant bit of the squared result,
an inverter having an input coupled to bit zero of the input vector to generate a complimented bit zero,
a first AND gate having a first input coupled to an output of the inverter to receive the complimented bit zero, a second input coupled to bit one of the input vector, and an output coupled to the third least significant bit of the squared result, the first AND gate to logically AND the complimented bit zero and bit one of the input vector together to generate the third least significant bit of the squared result on the output,
an EXCLUSIVE-OR gate having a first input coupled to bit one of the input vector, a second input coupled to bit two of the input vector, and an output, the EXCLUSIVE-OR gate to logically exclusive-or bit one of the input vector and bit two of the input vector together on the output, and
a second AND gate having a first input coupled to bit zero of the input vector and a second input coupled to the output of the EXCLUSIVE-OR gate, and an output coupled to the fourth least significant bit of the squared result, the second AND gate to logically AND bit zero of the input vector together with the output of the EXCLUSIVE-OR gate to generate the fourth least significant bit of the squared result on the output.

26. The integrated circuit of claim 20, wherein
the Kogge-Stone adder further to add the least significant bits zero through two of the first plurality of bits of the first vector and the least significant bits zero through two of the first plurality of bits of the second vector together to further generate least significant sum output bits of the hybrid multibit adder.

27. The integrated circuit of claim 20, wherein
the bits of the first and second vectors with the larger arrival times are added by the Kogge-Stone adder, and
the bits of the first and second vectors with the smaller arrival times are added by a Brent-Kung adder to balance the overall timing delay of the hybrid multibit adder.

* * * * *